US009307173B2

(12) United States Patent
Takamiya et al.

(10) Patent No.: US 9,307,173 B2
(45) Date of Patent: Apr. 5, 2016

(54) SIGNAL PROCESSING CIRCUIT, SOLID-STATE IMAGING DEVICE, AND CAMERA SYSTEM

(75) Inventors: Kenichi Takamiya, Fukuoka (JP); Yuji Gendai, Kanagawa (JP); Yasuaki Hisamatsu, Kanagawa (JP); Tadafumi Nagata, Nagasaki (JP)

(73) Assignee: SONY CORPORATION, Tokyo (JP)

( * ) Notice: Subject to any disclaimer, the term of this patent is extended or adjusted under 35 U.S.C. 154(b) by 622 days.

(21) Appl. No.: 13/064,911

(22) Filed: Apr. 26, 2011

(65) Prior Publication Data

US 2011/0279723 A1    Nov. 17, 2011

(30) Foreign Application Priority Data

May 13, 2010   (JP) .................................. 2010-111460
Feb. 17, 2011  (JP) .................................. 2011-032394

(51) Int. Cl.
| | | |
|---|---|---|
| *H04N 5/335* | (2011.01) | |
| *H04N 5/378* | (2011.01) | |
| *H03M 1/06* | (2006.01) | |
| *H04N 5/3745* | (2011.01) | |
| *H03M 1/12* | (2006.01) | |
| *H03M 1/56* | (2006.01) | |
| *H03M 1/68* | (2006.01) | |
| *H03M 1/74* | (2006.01) | |

(52) U.S. Cl.
CPC ............. *H04N 5/378* (2013.01); *H03M 1/0612* (2013.01); *H04N 5/3745* (2013.01); *H03M 1/123* (2013.01); *H03M 1/56* (2013.01); *H03M 1/687* (2013.01); *H03M 1/745* (2013.01); *H03M 1/747* (2013.01)

(58) Field of Classification Search
USPC ..................... 348/308; 250/208.1; 327/126
See application file for complete search history.

(56) References Cited

U.S. PATENT DOCUMENTS

| 5,602,506 | A  * | 2/1997  | Kim et al. ...................... 327/535 |
|---|---|---|---|
| 2005/0195304 | A1 | 9/2005 | Nitta et al. |
| 2006/0262209 | A1* | 11/2006 | Kishi ............................. 348/297 |
| 2008/0211951 | A1* | 9/2008 | Wakabayashi et al. ........ 348/308 |
| 2009/0009641 | A1* | 1/2009 | Asayama et al. .............. 348/294 |
| 2011/0114827 | A1* | 5/2011 | Yamaoka et al. .......... 250/214 R |
| 2011/0221619 | A1* | 9/2011 | Asayama et al. .............. 341/144 |

FOREIGN PATENT DOCUMENTS

JP         2005-278135         10/2005

OTHER PUBLICATIONS

W. Yang, "An Integrated 800×600 CMOS Image System," ISSCC Digest of Technical Papers, pp. 304-305, Feb. 1999.

* cited by examiner

*Primary Examiner* — James Hannett
*Assistant Examiner* — Stephen Coleman
(74) *Attorney, Agent, or Firm* — Hazuki International, LLC

(57) ABSTRACT

A signal processing circuit includes: a reference signal generating circuit that generates a reference signal of a ramp waveform of which a voltage value varies with the lapse of time by changing a current; and a signal processing unit including a plurality of processing sections that process the reference signal as a ramp wave and a potential of a supplied analog signal, wherein the reference signal processing circuit has a function of adjusting an offset of the reference signal by adjusting the current from the time of starting the generation of the reference signal or adjusting the level of the reference signal at least at the time of starting the generation of the reference signal.

25 Claims, 34 Drawing Sheets

FIG.29

|  | PV (P-PHASE VOLTAGE) | DV1 (D-PHASE VOLTAGE 1) | DV2 (D-PHASE VOLTAGE 2) |
|---|---|---|---|
| VSL VOLTAGE LEVEL | 5 | 100 | 200 |
| OUTPUT CODE | 150 | 3300 | 6300 |
| IDEAL LINE LN2 | 450 | 3300 | 6300 |
| LINEARITY ERROR | 300 (=450−150) | | |

SIGNAL PROCESSING CIRCUIT, SOLID-STATE IMAGING DEVICE, AND CAMERA SYSTEM

BACKGROUND OF THE INVENTION

1. Field of the Invention

The present invention relates to a signal processing circuit, a solid-state imaging device represented by a CMOS image sensor, and a camera system.

2. Description of the Related Art

A CMOS image sensor can be manufactured using the same manufacturing processes as a typical CMOS integrated circuit and can be driven with a single power source. In addition, analog circuits or logic circuits can be manufactured to coexist in a single chip using the CMOS processes.

Accordingly, that the CMOS image sensor has many advantages such as that the number of peripheral ICs can be reduced.

The mainstream of the output circuit of a CCD is a one-channel (ch) output type employing an FD amplifier having a floating diffusion (FD) layer.

In contrast, the CMOS image sensor includes an FD amplifier for each pixel and the mainstream of the output thereof is a parallel-column output type in which a row is selected out of a pixel array and pixels of the selected row are simultaneously read in the column direction.

This is because it is difficult to obtain the sufficient driving capability by the use of the FD amplifiers disposed in the pixels, it is thus necessary to lower the data rate, and the parallel process is advantageous.

Various circuits have been suggested as a pixel signal reading (output) circuit of the parallel-column output type CMOS image sensor.

In a most advanced type thereof, an analog-digital converter (hereinafter, abbreviated as "ADC") is provided for each column and a pixel signal is extracted as a digital signal.

Such a CMOS image sensor mounted with a parallel-column ADC is disclosed, for example, in W. Yang et al., "An Integrated 800×600 CMOS Image System," ISSCC Digest of Technical Papers, pp. 304-305, February, 1999 (non-patent document 1), or JP-A-2005-278135 (patent document 1).

FIG. 1 is a block diagram illustrating the configuration of a solid-state imaging device (CMOS image sensor) mounted with a parallel-column ADC.

As shown in FIG. 1, the solid-state imaging device 1 includes a pixel unit 2, a vertical scanning circuit 3, a horizontal transfer scanning circuit 4, and a column processing circuit group 5 including an ADC group.

The solid-state imaging device 1 further includes a digital-analog converter (hereinafter, abbreviated as "DAC") 6 as a reference signal generating circuit and a sense amplifier (S/A) 7.

The pixel unit 2 has a configuration in which unit pixels 21 each including a photodiode (photoelectric conversion element) and an intra-pixel amplifier are arranged in a matrix shape.

In the column processing circuit group 5, plural column processing circuits 51 constituting an ADC for each column are arranged.

Each column processing circuit (ADC) 51 includes a comparator 51-1 that compares an analog signal acquired from the pixels of each row via a vertical signal line with a reference signal RAMP (Vslop) of a ramp waveform (RAMP) which is obtained by changing a reference, signal generated from the DAC 6 in a step shape.

Each column processing circuit 51 further includes a counter latch (memory) 51-2 that counts a comparison time of the comparator 51-1 and latches the counted result.

The column processing circuit 51 has an n-bit digital signal converting function and is disposed for each of the vertical signal lines (column lines) 8-1 to 8-$n$, whereby a parallel-column ADC block is constructed.

The output of each memory 51-2 is connected to, for example, a horizontal transfer line 9 with a k-bit width.

Here, k sense amplifiers 7 corresponding to the horizontal transfer line 9 are arranged.

FIG. 2 is a timing diagram of the circuit shown in FIG. 1.

In each column processing circuit (ADC) 51, an analog signal (with a potential of Vs1) read to the vertical signal line 8 is compared with the reference signal RAMP (Vslop) varying step-like by the comparator 51-1 disposed for each column.

At this time, the counter latch 51-2 counts until the analog potential Vs1 and the level of the reference signal RAMP (Vslop) intersect each other and the output of the comparator 51-1 is inverted, and the potential (analog signal) Vs1 of the vertical signal line 8 is converted into a digital signal (that is, converted in an AD conversion manner).

The AD conversion is performed two times for one reading operation.

In the first AD conversion, reset levels (P phase) of the unit pixels 21 are read to the vertical signal line 8 (8-1 to 8-$n$) and the AD conversion is performed thereon.

The P phase of the reset levels includes individual differences of the pixels.

In the second AD conversion, signals (D phase) photoelectrically converted by the unit pixels 21 are read to the vertical signal line 8 (8-1 to 8-$n$) and the AD conversion is performed thereon.

Since the D phase also includes the individual differences of the pixels, the correlated double sampling (CDS) can be embodied by performing a subtraction of (D-phase level-P-phase level).

The signals converted into the digital signals are recorded in the counter latch 51-2, are sequentially read to the sense amplifier 7 via the horizontal transfer line 9 by the horizontal (column) transfer scanning circuit 4, and are finally output.

In this way, the parallel-column output process is performed.

The counting process in the counter latch 51-2 for the P phase is referred to as a first sampling and the counting process in the counter latch 51-2 for the D phase is referred to as a second sampling.

SUMMARY OF THE INVENTION

However, in recent camera systems mounted with a solid-state imaging device, the number of pixels has increased and the frame rate has increased. For the purpose of dealing with these tendencies, it is necessary to enhance the reading speed.

Here, the settling time of an analog signal causes a problem. The settling time does not cause a severe problem in the case of a small-sized sensor. However, in case of a large-sized sensor, since the block size is large and the distance between blocks is great, the line load between the blocks is likely to increase.

That is, in a large-sized sensor, it is necessary to guarantee a long settling time, thereby making it difficult to enhance the speed.

When the AD conversion is performed without sufficiently guaranteeing the settling time, the difference in the settling time between the columns appears in the output value as it is, thereby greatly influencing the image quality.

This problem will be reviewed with reference to a DAC circuit for the generation of a reference signal.

The DAC circuit used in a parallel-column AD converter of a solid-state imaging device is exemplified, but the same problem exists in typical DAC circuits for generation of a reference signal.

FIG. 3 is a diagram illustrating a DAC circuit outputting a reference signal (voltage) and reception blocks receiving the reference signal.

A RAMP line 10 is connected between the blocks. A line load is parasitic on the actual RAMP line 10 and is determined depending on the line length between the blocks or the line width.

Since the line load is likely to increase in a large-sized sensor, the settling time is necessary.

FIG. 4 is a diagram illustrating a reference signal (voltage) output from the DAC as the reference signal generating circuit.

The reference signal RAMP is a signal varying with a constant slew rate from a predetermined time, but gets blunt at a start point and an end point in anyway due to the influence of the line load.

This depends on a resistor R and a capacitor C parasitic on the RAMP line 10. When the load RC increases, the degree of bluntness increases. Since the blunt part is not linear, the part cannot be used as a reference voltage.

Only the effective range VLR shown in FIG. 4 can be used in practice. That is, when the reference signal RAMP gets blunt, the effective range decreases.

Accordingly, when it is intended to guarantee a desired effective range, it is necessary to set the range of the reference voltage RAMP in consideration of the settling time STL.

When the DAC 6a as a reference signal generating circuit has a design margin, the reference signal RAMP has only to be output for longer. However, when the design margin is not guaranteed sufficiently, a countermeasure such as a change in the circuit configuration is necessary. This problem is not described any more herein.

When the period of the reference signal RAMP increases, the AD conversion period also increases by as much, whereby the increase in frame rate becomes severe.

In the above-mentioned parallel-column AD converter, since the AD conversion is typically performed two times for the P phase and the D phase, it is necessary to guarantee double the settling time STL shown in FIG. 4.

This settling time causes a problem in the increase in speed.

As a countermeasure against this problem, the decrease in load parasitic on the RAMP line 10 is generally carried out.

Countermeasures such as an increase in line width to lower the resistance or a change to a stacked structure are carried out. However, since the other line layout conditions become severe, disadvantages such as an increase in chip area may be caused.

FIG. 5 is a diagram illustrating models of the DAC as a reference signal generating circuit and a line capacitor C.

The principle in that the reference signal gets blunt will be described below with reference to FIG. 5. For the purpose of simplifying the explanation, a line resistor is not shown in FIG. 5.

A RAMP current source I1 shown in FIG. 5 generates a current I having a constant slew rate and generates a reference voltage RAMP by causing the current to flow in an output resistor Rout.

When the line capacitor C does not exist, the current I can be drawn out from the output resistor Rout (I=Ir). However, since a steady current Ic actually flows out of the line capacitor C, the current drawn out of the output resistor Rout decreases by the steady current Ic (Ir=I−Ic).

The steady current Ic is a current value depending on the slew rate and the line capacitor C.

When the current I of the RAMP current source is greater than the steady current Ic, a current with a constant slew rate can be made to flow in the output resistor Rout while the steady current Ic is maintained, whereby it is possible to guarantee the linearity of the reference signal RAMP.

However, when the current I is small just after the generation of the reference signal RAMP is started or the like, the steady current Ic does not flow. Accordingly, a current with a desired slew rate cannot be made to flow in the output resistor Rout, whereby the reference voltage gets blunt.

Therefore, it is desirable to provide a signal processing circuit, a solid-state imaging device, and a camera system that can generate a reference signal having linearity just after the start of generation, improve a settling time greatly, and enlarge a dynamic range.

According to an embodiment of the invention, there is provided a signal processing circuit including: a reference signal generating circuit that generates a reference signal of a ramp waveform of which a voltage value varies with the lapse of time by changing a current; and a signal processing unit including a plurality of processing sections that process the reference signal as a ramp wave and a potential of a supplied analog signal. Here, the reference signal processing circuit has a function of adjusting an offset of the reference signal by adjusting the current from the time of starting the generation of the reference signal or adjusting the level of the reference signal at least at the time of starting the generation of the reference signal.

According to another embodiment of the invention, there is provided a solid-state imaging device including: a pixel unit in which a plurality of pixels performing a photoelectric conversion are arranged in a matrix shape; and a pixel signal reading unit including a column signal processing circuit that reads pixel signals from the pixel unit to signal lines in terms of a plurality of pixels and performs an analog-digital (AD) conversion on the read pixel signals. Here, the column signal processing circuit of the pixel signal reading unit includes a reference signal generating circuit that generates a reference signal of a ramp waveform of which a voltage value varies with the lapse of time by changing a current, a plurality of comparators that compare the reference signal as a ramp wave with a potential of an analog signal read from the corresponding column, and a plurality of counter latches that are disposed to correspond to the plurality of comparators, count a comparison time of the corresponding comparator, and stops the counting and latches the counted value when the output of the corresponding comparator is inverted. The reference signal processing circuit has a function of adjusting an offset of the reference signal by adjusting the current from the time of starting the generation of the reference signal or adjusting the level of the reference signal at least at the time of starting the generation of the reference signal.

According to still another embodiment of the invention, there is provided a camera system including: a solid-state imaging device; and an optical system that forms an image of a subject on the solid-state imaging device. Here, the solid-state imaging device includes a pixel unit in which a plurality of pixels performing a photoelectric conversion are arranged in a matrix shape, and a pixel signal reading unit including a column signal processing circuit that reads pixel signals from the pixel unit to signal lines in terms of a plurality of pixels and performs an analog-digital (AD) conversion on the read pixel signals. Here, the column signal processing circuit of the pixel signal reading unit includes a reference signal generating circuit that generates a reference signal of a ramp waveform of which a voltage value varies with the lapse of time by changing a current, a plurality of comparators that compare the reference signal as a ramp wave with a potential of an analog signal read from the corresponding column, and a plurality of counter latches that are disposed to correspond to the plurality of comparators, count a comparison time of the corresponding comparator, and stops the counting and latches the counted value when the output of the corresponding comparator is inverted. The reference signal processing circuit has a function of adjusting an offset of the reference signal by adjusting the current from the time of starting the generation of the reference signal or adjusting the level of the reference signal at least at the time of starting the generation of the reference signal.

According to the above-mentioned embodiments of the invention, it is possible to generate a reference signal having linearity just after the start of generation, improve a settling time greatly, and enlarge a dynamic range.

BRIEF DESCRIPTION OF THE DRAWINGS

FIG. 29 is a diagram illustrating an example of a memory management method in logic.

DESCRIPTION OF THE PREFERRED EMBODIMENTS

Hereinafter, embodiments of the invention will be described with reference to the accompanying drawings.

The description is made in the following order of contents.
1. Overall Configuration of Solid-state Imaging Device
2. Configuration of Column ADC
3. First Formation of Reference Signal by DAC
4. Second Formation of Reference Signal by DAC
5. Configuration of Camera System FIG. 6 is a block diagram illustrating the configuration of a solid-state imaging device (CMOS image sensor) mounted with a parallel-column ADC according to an embodiment of the invention.

Figure 1:
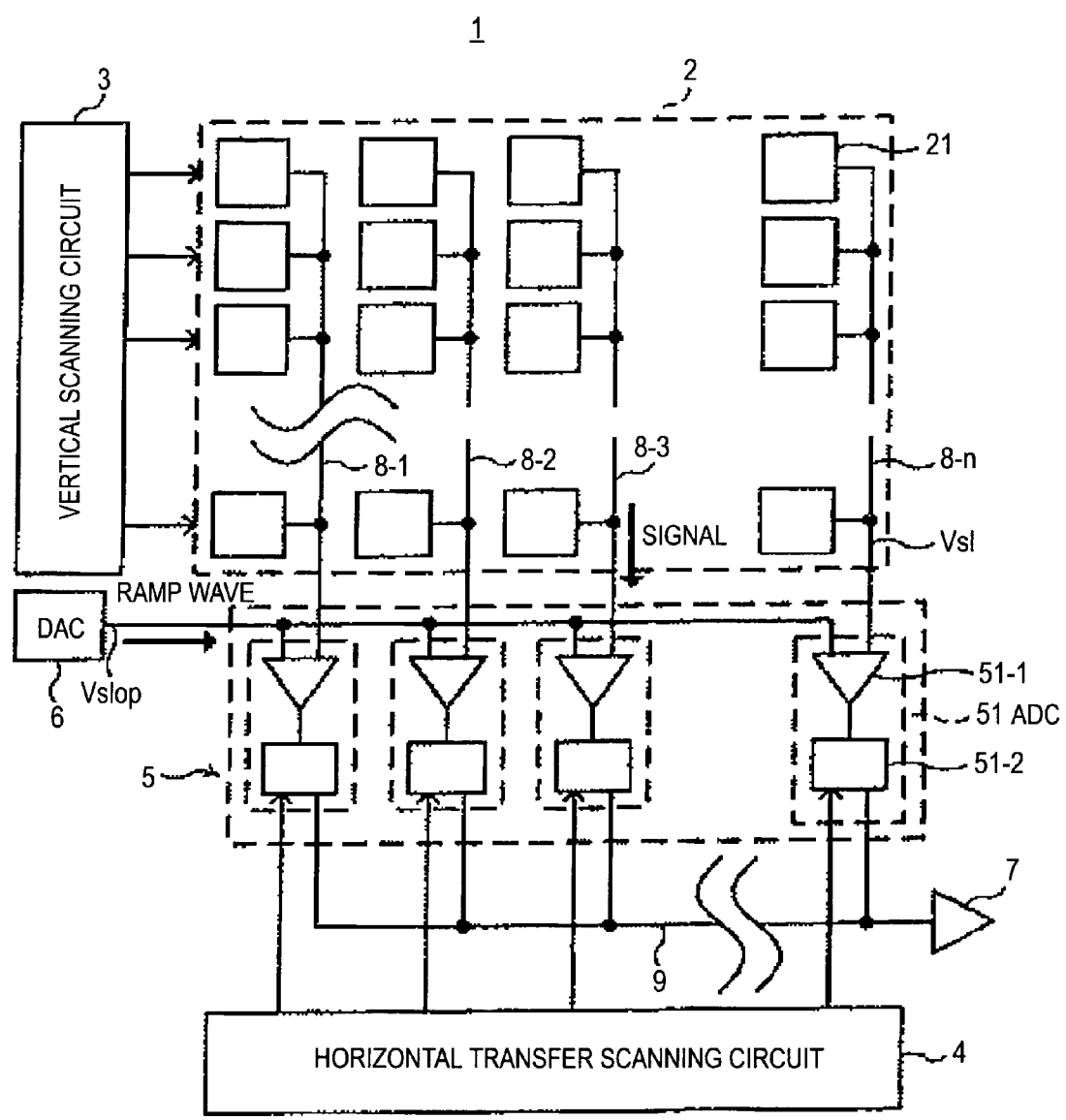
FIG. 1 is a block diagram illustrating the configuration of a solid-state imaging device (CMOS image sensor) mounted with a parallel-column ADC.
Figure 2:
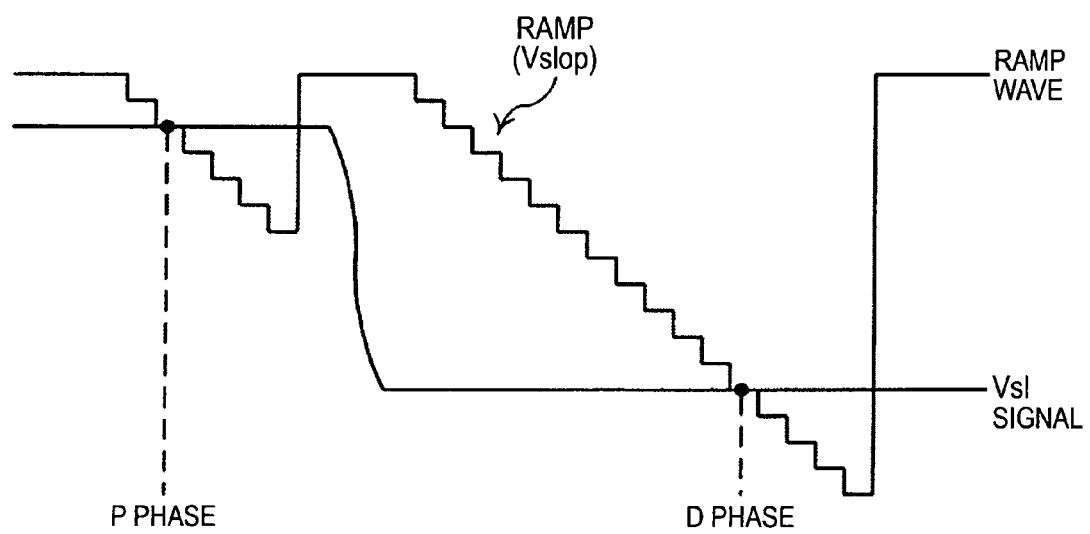
FIG. 2 is a timing diagram of the circuit shown in FIG. 1.
Figure 3:
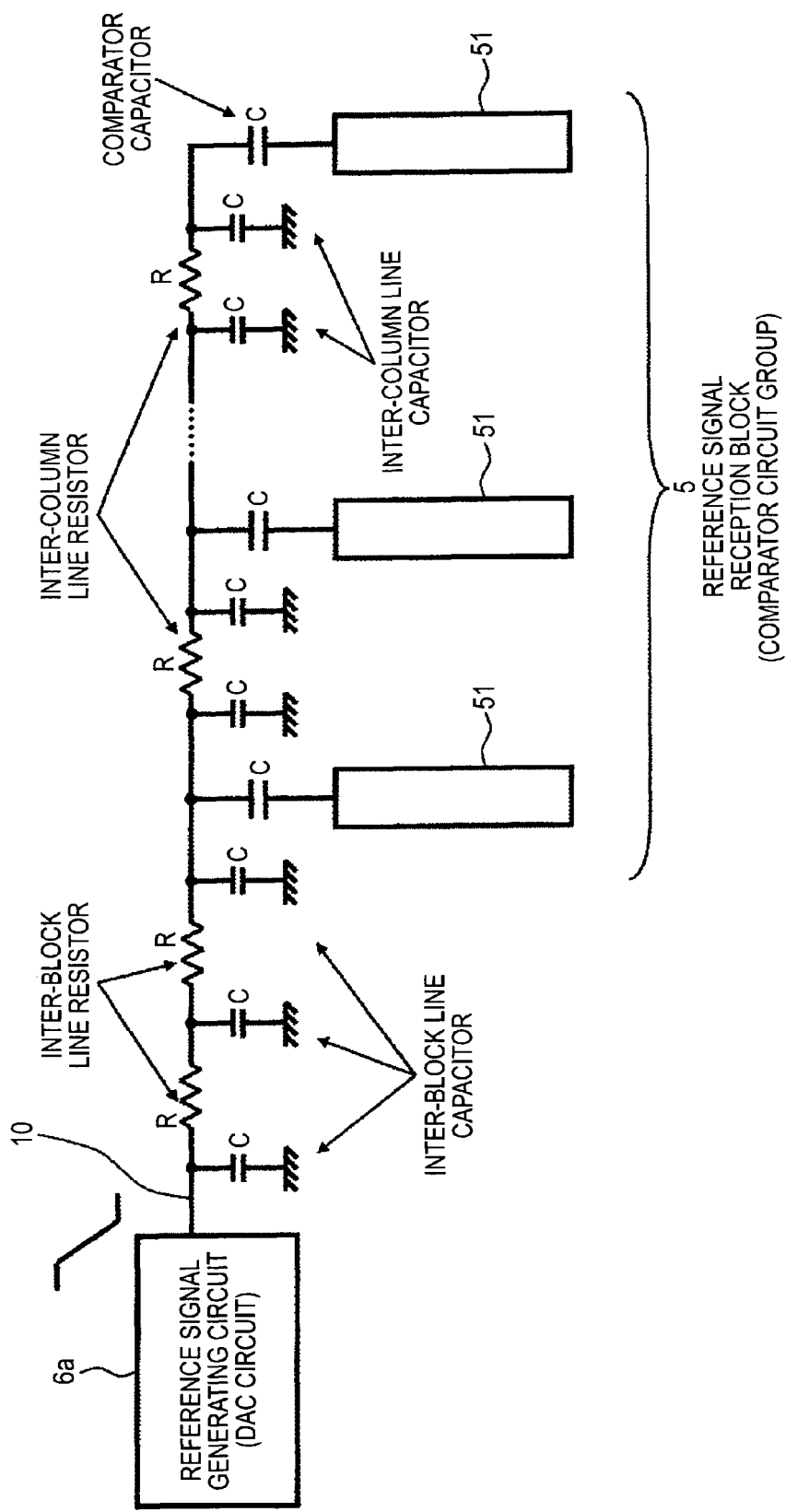
FIG. 3 is a diagram illustrating a DAC circuit outputting a reference voltage and reception blocks receiving the reference voltage.
Figure 4:
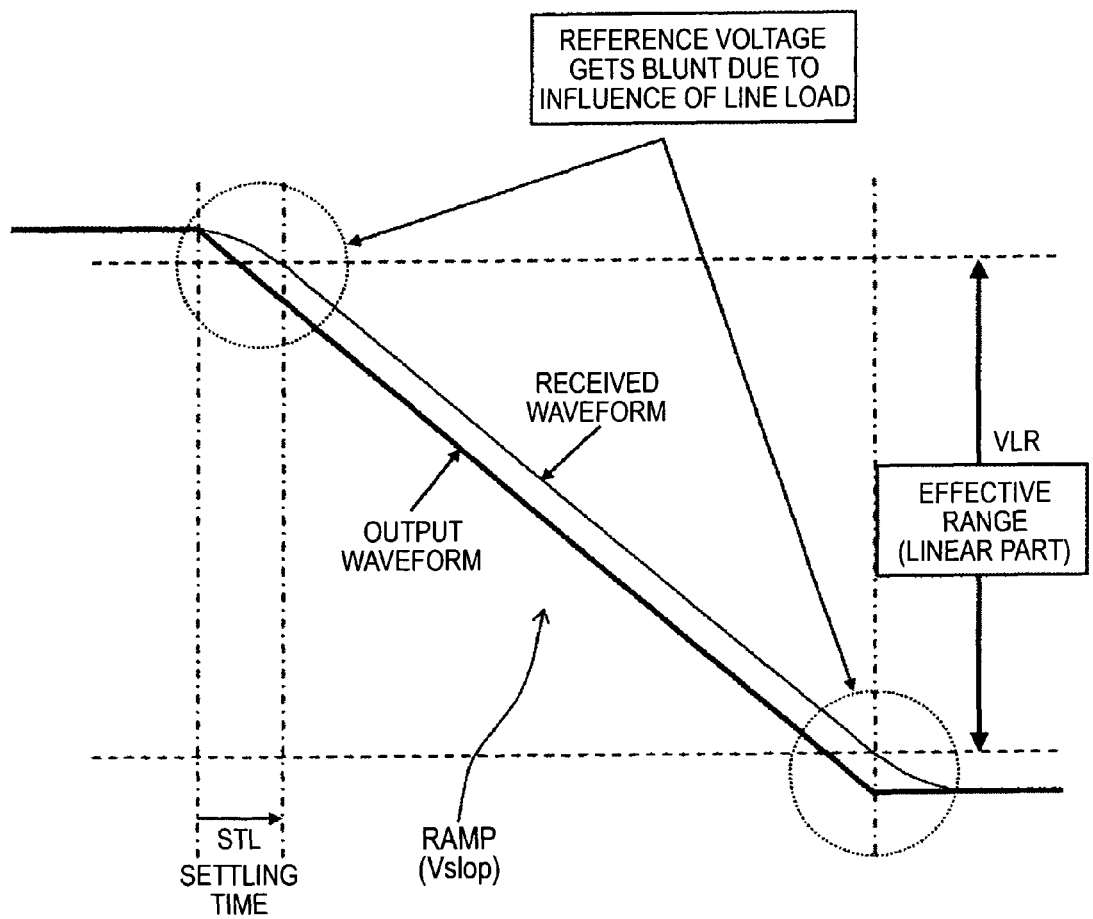
FIG. 4 is a diagram illustrating a reference signal (voltage) output from a DAC as a reference signal generating circuit.
Figure 5:
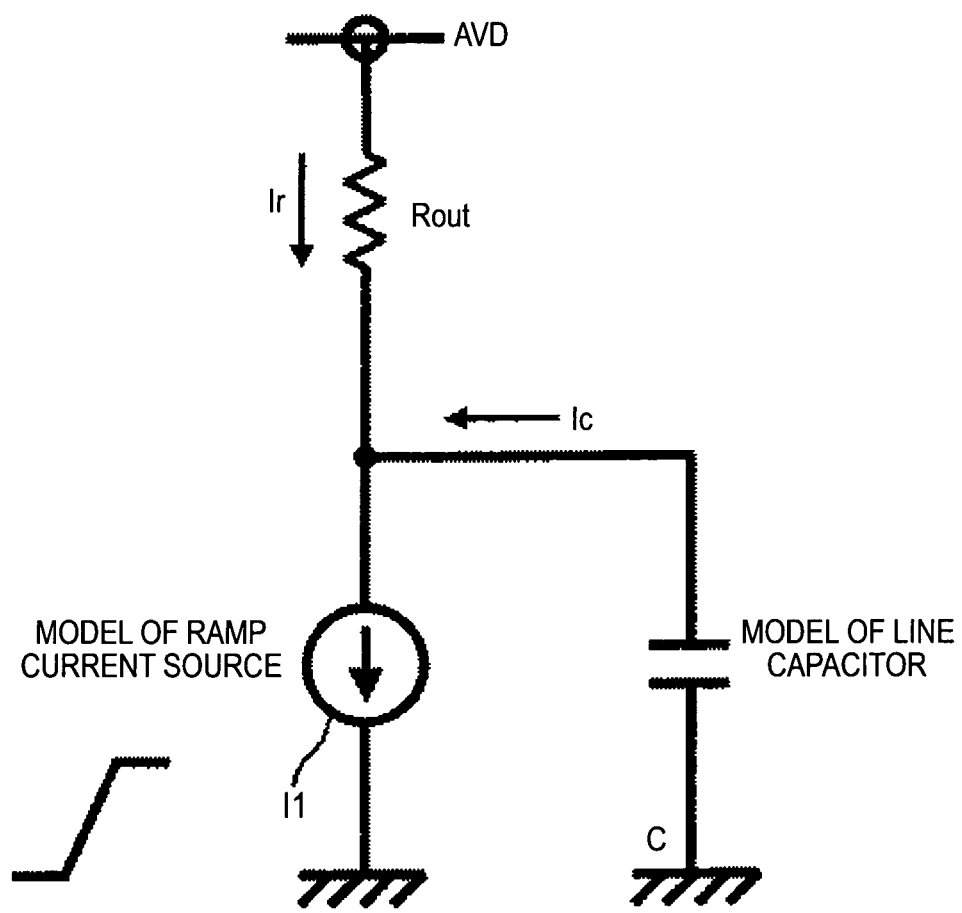
FIG. 5 is a diagram illustrating models of the DAC as a reference signal generating circuit and a line capacitor C.
Figure 6:
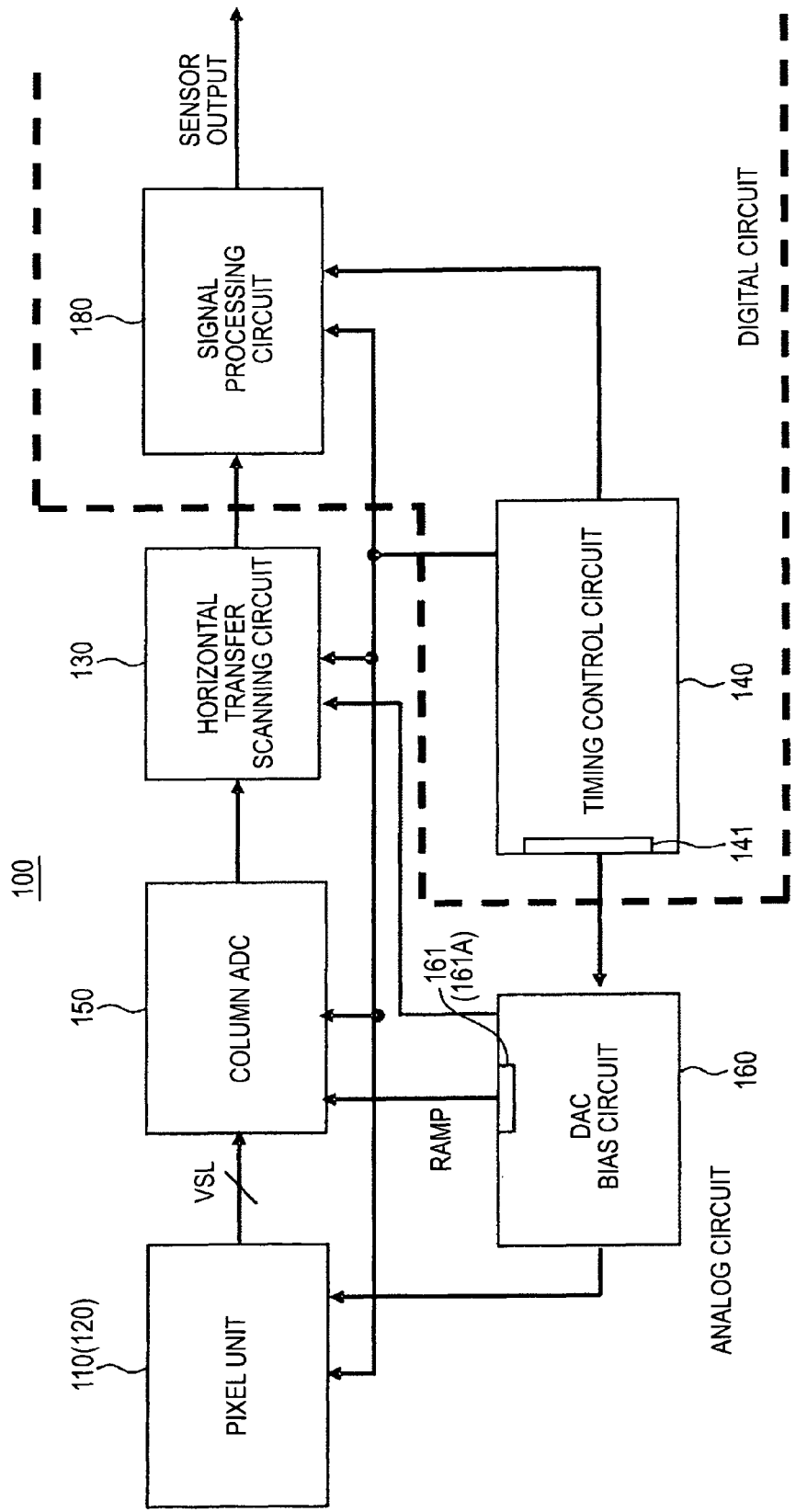
FIG. 6 is a block diagram illustrating the configuration of a solid-state imaging device (CMOS image sensor) mounted with a parallel-column ADC according to an embodiment of the invention.
Figure 7:
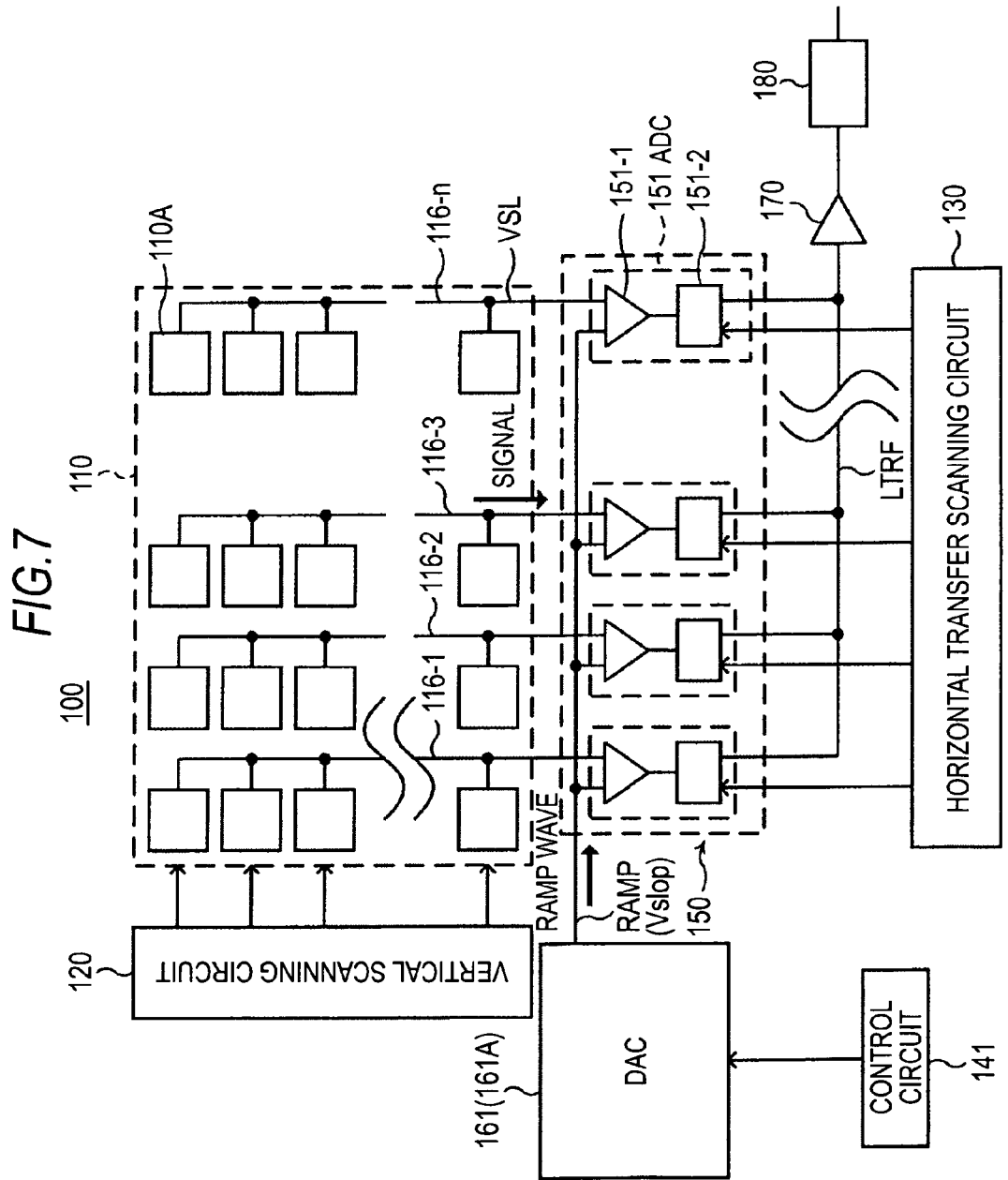
FIG. 7 is a block diagram specifically illustrating an ADC group in the solid-state imaging device (CMOS image sensor) mounted with the parallel-column ADC shown in FIG. 6.

FIG. 7 is a block diagram specifically illustrating an ADC group in the solid-state imaging device (CMOS image sensor) mounted with the parallel-column ADC shown in FIG. 6.

<1. Configuration of Solid-State Imaging Device>

As shown in FIGS. 6 and 7, the solid-state imaging device 100 includes a pixel unit 110 as an imaging unit, a vertical scanning circuit 120, a horizontal transfer scanning circuit 130, and a timing control circuit 140.

The solid-state imaging device 100 further includes a column processing circuit group 150 which is an ADC group as a pixel signal reading unit and a DAC and bias circuit 160 including a DAC (digital-analog converter) 161.

The solid-state imaging device 100 further includes an amplifier circuit (S/A) 170 and a signal processing circuit 180.

Among these elements, the pixel unit 110, the vertical scanning circuit 120, the horizontal transfer scanning circuit 130, the column processing circuit group (ADC group) 150, the DAC and bias circuit 160, and the sense amplifier (S/A) 170 are constructed by analog circuits.

The timing control circuit 140 and the signal processing circuit 180 are constructed by digital circuits.

The DAC as a reference signal generating circuit according to the embodiment of the invention generating a reference signal RAMP basically has the following specific configuration.

The DAC 161 according to this embodiment has a first configuration for allowing a settling current other than a current used to generate the reference signal (voltage) RAMP to flow for a predetermined period of time from the time of starting the generation of the reference signal RAMP.

The DAC 161 has a function of adjusting the number of current sources allowing a current to flow at the time of starting the generation of the reference signal RAMP to give an offset to the reference signal RAMP.

The DAC 161 includes plural dedicated current sources independently of the reference-voltage generating current source to give an offset to the reference signal RAMP and can finely adjust the offset.

The DAC 161 can switch a back-bias voltage of a reference-voltage generating current source transistor to give an offset to the reference signal RAMP.

The DAC 161 is configured to automatically adjust the offset of the reference signal when the slope of the reference signal RAMP is variable and the slope of the reference signal RAMP varies.

The DAC 161 is configured to make a synchronization using flip flops FF so as to absorb a difference between the time of starting the generation of the reference signal RAMP and the current application time.

In this embodiment, a dummy pixel that inputs a voltage to the vertical signal line VSL from the outside, a voltage generating circuit that applies a voltage level of the dummy pixel circuit, and a horizontal-connection switch that smoothes the input voltage level are provided to detect the optimal settling current.

The DAC 161 according to this embodiment may have a second configuration other than the first configuration.

A DAC 161A having the second configuration includes a reference-signal generating current source connected to an output node of a reference signal and an output load portion that is connected to the output node and allows a reference signal of the level corresponding to a reference-signal generating current from the reference-signal generating current source to appear at the output node. The output load portion sets a first load value before starting the generation of the reference signal to a load value different from a second load value at the time of starting the generation of the reference signal.

The DAC 161A sets the load value of the output load portion to a second load value within a predetermined period of time from the time of starting the generation of the reference signal.

The DAC 161A sets the load value of the output load portion to the first load value after the predetermined period of time passes from the time of starting the generation of the reference signal.

The output load portion of the DAC 161A includes plural adjusting loads and has a function of adjusting the number of adjusting loads to give an offset to the reference signal.

Similarly to the first configuration, the DAC 161A may include a circuit automatically adjusting the offset of the reference signal when the slope of the reference signal is variable and the slope of the reference signal varies.

The configurations of the DAC and the like will be described in detail later.

In the pixel unit 110, plural unit pixels 110A each including a photodiode (photoelectric conversion element) and an intra-pixel amplifier are arranged in a two-dimensional shape (matrix shape) of m rows and n columns.

[Configuration of Unit Pixel]

Figure 8:
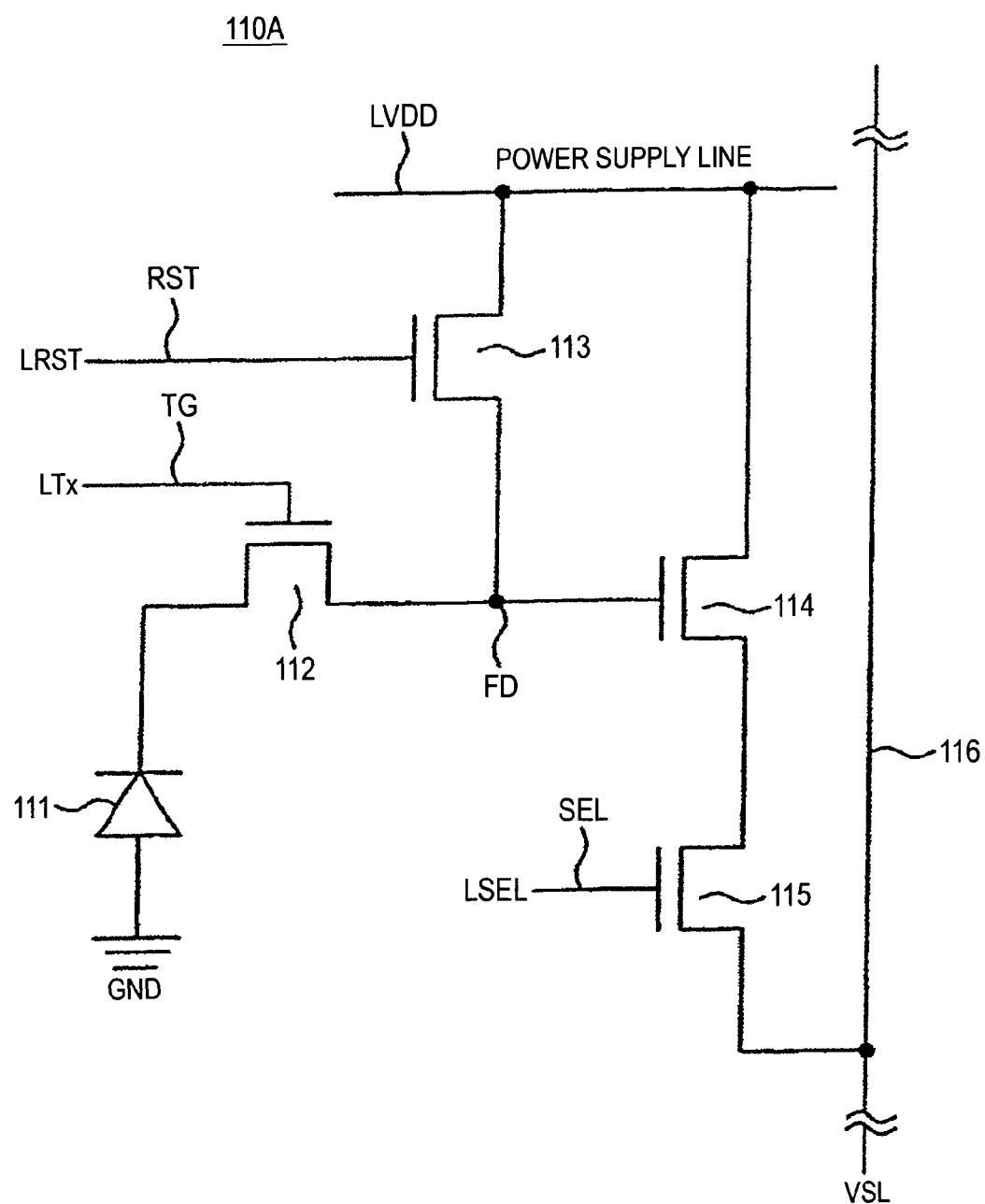
FIG. 8 is a diagram illustrating an example of a pixel of the CMOS image sensor including four transistors according to the embodiment of the invention.

FIG. 8 is a diagram illustrating an example of a pixel of the CMOS image sensor including four transistors according to this embodiment.

Each unit pixel 110A includes, for example, a photodiode 111 as a photoelectric conversion element.

The unit pixel 110A includes four transistors of a transfer transistor 112 as a transfer element, a reset transistor 113 as a reset element, an amplification transistor 114, and a selection transistor 115 as active elements for a single photodiode 111.

The photodiode 111 photoelectrically converts incident light into electric charges (electrons herein) corresponding to the light intensity thereof.

The transfer transistor 112 is connected between the photodiode 111 and a floating diffusion FD as an output node.

The transfer transistor 112 transfers the electrons photoelectrically converted by the photodiode 111 as a photoelectric conversion element to the floating diffusion FD when the gate (transfer gate) thereof is supplied with a drive signal TG via a transfer control line LTx.

The reset transistor 113 is connected between a power supply line LVDD and the floating diffusion FD.

The reset transistor 113 resets the potential of the floating diffusion FD to the potential of the power supply line LVDD when the gate thereof is supplied with a reset signal RST via a reset control line LRST.

The gate of the amplification transistor 114 is connected to the floating diffusion FD. The amplification transistor 114 is connected to the vertical signal line 116 via the selection transistor 115 and forms a source follower along with a constant current source outside the pixel unit.

When a control signal (an address signal or a selection signal) SEL is supplied to the gate of the selection transistor 115 via a selection control line LSEL, the selection transistor 115 is turned on.

When the selection transistor 115 is turned on, the amplification transistor 114 amplifies the potential of the floating diffusion FD and outputs a voltage corresponding to the amplified potential to the vertical signal line 116. The voltages output from the pixels via the vertical signal lines 116 are output to the column processing circuit group 150 as a pixel signal reading unit.

These operations are simultaneously performed on the pixels in a row in parallel, for example, because the gates of the transfer transistor 112, the reset transistor 113, and the selection transistor 115 are connected in terms of rows.

A set of the reset control line LRST, the transfer control line LTx, and the selection control line LSEL arranged in the pixel unit 110 is provided for each row of the pixel arrangement.

The reset control line LRST, the transfer control line Ltx, and the selection control line LSEL are driven by the vertical scanning circuit 120 as a pixel driving unit.

The solid-state imaging device 100 includes a timing control circuit 140 generating internal clocks, a vertical scanning circuit 120 controlling the row addressing or the row scanning, and a horizontal transfer scanning circuit 130 controlling the column addressing or the column scanning as a control circuit sequentially reading signals of the pixel unit 110.

The timing control circuit 140 generates timing signals necessary for the signal processing of the pixel unit 110, the vertical scanning circuit 120, the horizontal transfer scanning circuit 130, the column processing circuit group 150, the DAC and bias circuit 160, and the signal processing circuit 180.

The timing control circuit 140 includes a DAC controller 141 that controls the generation of a reference signal RAMP (Vslop) of the DAC 161 in the DAC and bias circuit 160.

The pixel unit 110 photoelectrically converts a video or an image for each pixel by the storage and discharge of photons using a line shutter, and outputs analog signals VSL to the column processing circuits 151 of the column processing circuit group 150.

An ADC block (each column section) of the ADC group 150 performs an APGA-corresponding integral ADC and a digital CDS using the reference signal (ramp signal) RAMP from the DAC 161 on the analog output of the pixel unit 110, and outputs digital signals of several bits.

<2. Configuration of Column ADC>

The column processing circuit group 150 according to this embodiment includes column processing circuits (ADC) 151 as an ADC block arranged in plural columns.

That is, the column processing circuit group 150 has a k-bit digital signal conversion function and the column processing circuits are arranged for the vertical signal lines (column lines) 116-1 to 116-n, respectively, to form parallel-column ADC blocks.

Each ADC 151 includes a comparator 151-1 comparing an analog signal Vs1 acquired from the pixels of each row via the vertical signal line with the reference signal RAMP (Vslop) having a ramp waveform in which the reference signal generated by the DAC 161 is made to vary with the lapse of time.

Each ADC further includes a counter latch 151-2 that counts the comparison time and that latches the count result.

The output of the counter latch 151-2 is connected, for example, to a horizontal transfer line LTRF with a k-bit width.

Here, k sense amplifiers 170 and signal processing circuit 180 are disposed to correspond to the horizontal transfer line LTRF.

In the ADC group 150, the analog signal potential Vs1 read to the vertical signal line 116 is compared with the reference signal Vslop (a ramp signal RAMP having a slope waveform varying along a line with a certain slope) by the comparator 151-1 disposed for each column.

At this time, similarly to the comparator 151-1, the counter latch 151-2 disposed for each column is activated.

Each ADC 151 converts the potential (analog signal) Vs1 of the vertical signal line 116 into a digital signal by causing the count value and the reference signal RAMP (Potential Vslop) having a ramp waveform to vary in a one-to-one correspondence.

The ADC 151 coverts the variation in voltage of the reference signal RAMP (potential Vslop) into a variation in time and generates a digital value by counting the time with a predetermined period (clock).

When the analog signal Vs1 and the reference signal RAMP (Vslop) intersect each other, the output of the comparator 151-1 is inverted, and the input clock of the counter latch 151-2 is stopped or the clock of which the input has been stopped is input to the counter latch 151-2, whereby the AD conversion is finished.

When the AD conversion period is ended, the data latched in the counter latch 151-2 is transferred to the horizontal transfer line LTRF by the horizontal transfer scanning circuit 130 and is input to the signal processing circuit 180 via the sense amplifier 170. A two-dimensional image is generated therein by a predetermined signal process.

The horizontal transfer scanning circuit 130 simultaneously transfers several channels in parallel to guarantee a transfer rate.

The timing control circuit 140 generates timing signals necessary for the signal processing of the blocks of the pixel unit 110 and the column processing circuit group 150.

The signal processing circuit 180 at the subsequent stage performs a process of correcting a vertical line defect or a point defect or a signal clamping process for the read signal, or digital signal processes such as parallel-serial conversion, compression, encoding, addition, averaging, and intermittent action.

In the solid-state imaging device 100 according to this embodiment, the digital output of the signal processing circuit 180 is transmitted as an input of an ISP or a baseband LSI.

In an exemplary method of reading the pixel signals in the CMOS image sensor, signal charges as a light signal generated by the photoelectric conversion element such as a photodiode are temporarily sampled into the previous capacitor through the use of the MOS switch disposed in the vicinity thereof and the sampled signal charges are read.

In a sampling circuit, noise having an inverse correlation with the value of the sampling capacitor is caused. In a pixel, when the signal charges are transferred to the sampling capacitor, the signal charges are completely transferred using a potential gradient. Accordingly, noise is not caused in the sampling process, but noise is caused when the voltage level of the previous capacitor is reset to a reference value.

The CDS (Correlated Double Sampling) method is used as a method of removing the noise.

In this method, the state (reset level) just before sampling the signal charges is read and stored once and then the signal level after sampling the signal charges is read and subtracted, thereby removing the noise.

The DAC 161 generates the reference signal (ramp signal) as a slope waveform varying in a line shape with a slope and supplies the reference signal RAMP to the column processing circuit group 150, under the control of the DAC controller 141.

<3. First Formation of Reference Signal by DAC>

The DAC as a reference signal generating circuit according to this embodiment generating the reference signal RAMP basically has the following specific first configuration as described above.

The DAC 161 according to this embodiment has a configuration for allowing a settling current other than the current used to generate the reference signal (voltage) RAMP to flow for a predetermined period of time from the time of starting the generation of the reference signal RAMP.

The DAC 161 has a function of adjusting the number of current sources allowing a current to flow at the time of starting the generation of the reference signal RAMP to give an offset to the reference signal RAMP.

The DAC 161 includes plural dedicated current sources independently of the reference-voltage generating current source to give an offset to the reference signal RAMP and can finely adjust the offset.

The DAC 161 can switch a back-bias voltage of a reference-voltage generating current source transistor to give an offset to the reference signal RAMP.

The DAC 161 is configured to automatically adjust the offset of the reference signal when the slope of the reference signal RAMP is variable and the slope of the reference signal RAMP varies.

The DAC 161 is configured to make a synchronization using flip flops FF so as to absorb a difference between the time of starting the generation of the reference signal RAMP and the current application time.

In this embodiment, a dummy pixel that inputs a voltage to the vertical signal line VSL from the outside, a voltage generating circuit that applies a voltage level to the dummy pixel circuit, and a horizontal-connection switch that smooths the input voltage level are provided to detect the optimal settling current.

The specific configuration and function of generating the reference signal RAMP will be described in detail below.

The DAC 161 according to this embodiment has a configuration for generating the reference signal RAMP having linearity just after starting the generation of the reference signal, regardless of the line load parasitic on the RAMP line.

A reason that the reference signal RAMP gets blunt just after starting the generation of the reference signal is as follows. That is, a steady current is not made to flow completely just after starting the generation of the reference signal.

Therefore, the first configuration according to this embodiment provides a dedicated current source I162 allowing a steady current to flow, independently of the RAMP current source I161 for the generation of the reference signal.

In this embodiment, the dedicated current source is referred to as a settling current source.

Figure 9:
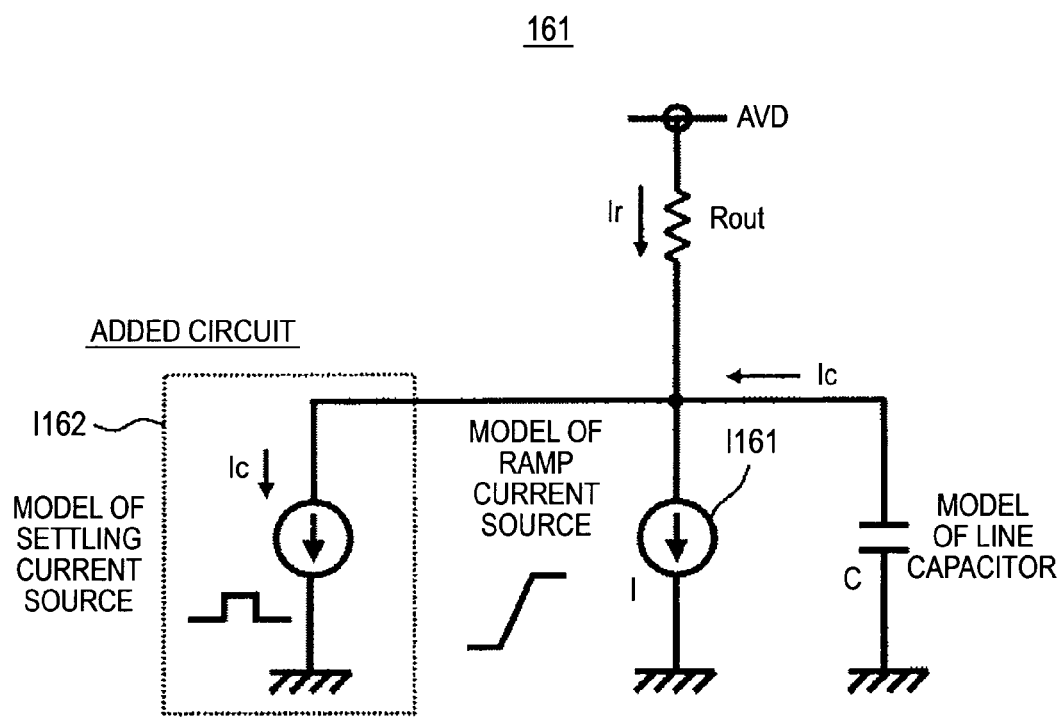
FIG. 9 is a diagram illustrating models of a DAC having a settling current source as a reference signal generating circuit and a line capacitor C according to the embodiment of the invention.

FIG. 9 is a diagram illustrating models of a DAC having a settling current source as a reference signal generating circuit and a line capacitor C according to this embodiment.

The settling current source I162 is turned on in parallel at the same time as starting the generation (starting the output) of the reference signal RAMP and serves as a current source allowing a steady current Ic to flow in the output period of the reference signal RAMP.

The steady current Ic is calculated by a product of a slew rate K and a line capacitance C. Accordingly, when the slew rate K is changed, it is necessary to change the steady current together.

Since the settling current source I161 is provided independently of the RAMP current source (main current source) I161, all the current I of the RAMP current source I161 can flow to an output resistor Rout just after starting the generation of the reference signal RAMP, whereby it is possible to solve the problem with the bluntness of the reference signal.

The circuit configuration of the DAC employing the above-mentioned principle will be described below.

Figure 10:
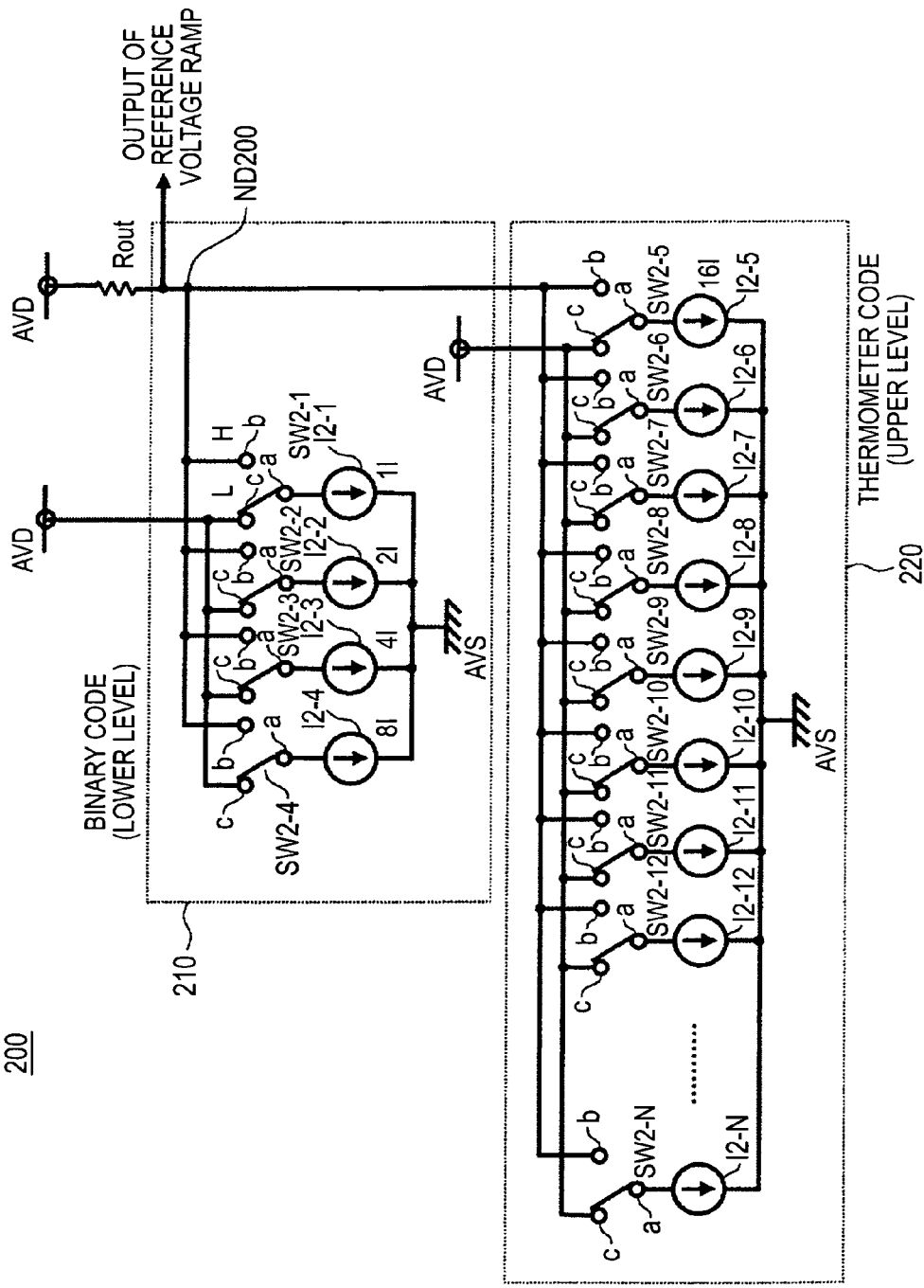
FIG. 10 is a circuit diagram illustrating an example of the DAC as a reference signal generating circuit.

FIG. 10 is a circuit diagram illustrating an example of the DAC as a reference signal generating circuit.

Hereinafter, the DAC is represented by reference numeral 200.

The DAC 200 shown in FIG. 10 has a segment type circuit configuration in which a binary code section 210 and a thermometer code section 220 are combined.

The binary code section 210 includes current sources I2-1 to I2-4 and switches SW2-1 to SW2-4.

The current sources I2-1 to I2-4 are configured to have current supply capacities of 1I, 2I, 4I, and 8I.

Each of the switches SW2-1 to SW2-4 switches the electrical connection between terminal a and terminal b or c.

The current sources I2-1 to I2-4 are connected between terminals a of the switches SW2-1 to SW2-4 and a reference potential AVS.

Terminal b of each of the switches SW2-1 to SW2-4 are connected to the output node ND200 of the reference signal (voltage) RAMP. The output node ND200 is connected to a power source AVD via the output resistor Rout.

Terminal c of each of the switches SW2-1 to SW2-4 is connected to the power source AVD.

The thermometer code section 220 includes current sources I2-5 to I2-N and switches SW2-5 to SW2-N.

The current sources I2-5 to I2-N are configured to have a current supply capacity of 16I.

Each of the switches SW2-5 to SW2-N switches the electrical connection between terminal a and terminal b or c.

Each of the current sources I2-5 to I2-N is connected between terminal a of the switches SW2-5 to SW2-N and the reference potential AVS.

Terminal b of each of the switches SW2-5 to SW2-N is connected to the output node ND200 of the reference signal (voltage) RAMP.

Terminal c of each of the switches SW2-5 to SW2-N is connected to the power source AVD.

The DAC 200 shown in FIG. 10 synthesizes currents of plural current sources and generates a voltage by allowing the synthesized current to flow in the output resistor Rout.

To generate the reference voltage with a constant slew rate, it is necessary to adjust the current flowing in the output resistor Rout every predetermined time.

The adjustment of the current is performed by the use of the switches SW2-1 to SW2-N of the current sources and the switches SW are controlled to keep the constant slew rate.

The configuration of each current source shown in FIG. 10 will be described below.

Figure 11:
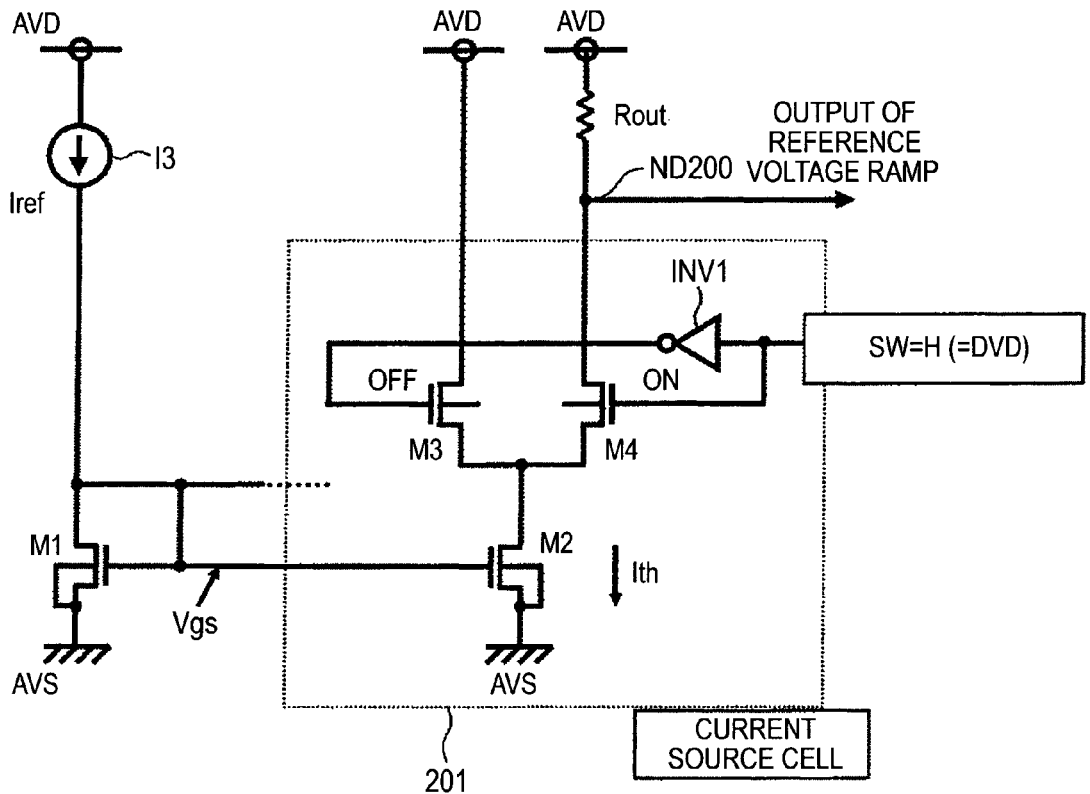
FIG. 11 is a circuit diagram illustrating a current source.

FIG. 11 is a circuit diagram illustrating a current source.

The current source shown in FIG. 11 has a current mirror configuration and a current value Ith is determined depending on a reference current Iref of a reference current source I3 and a transistor ratio of the NMOS transistors M1 and M2.

Differential transistors M3 and M4 perform a control on whether the current Ith should flow in the output resistor Rout or flow in the reverse path. These two transistors serve as a switch SW.

FIG. 11 shows an example of SW=H and the current Ith flows in the output resistor Rout.

The current source of the binary-code DAC shown in FIG. 9 is embodied by changing a W/L ratio of the transistor M2 by squaring. Here, W represents the channel width of the transistor and L represents the channel length thereof.

Figure 12:
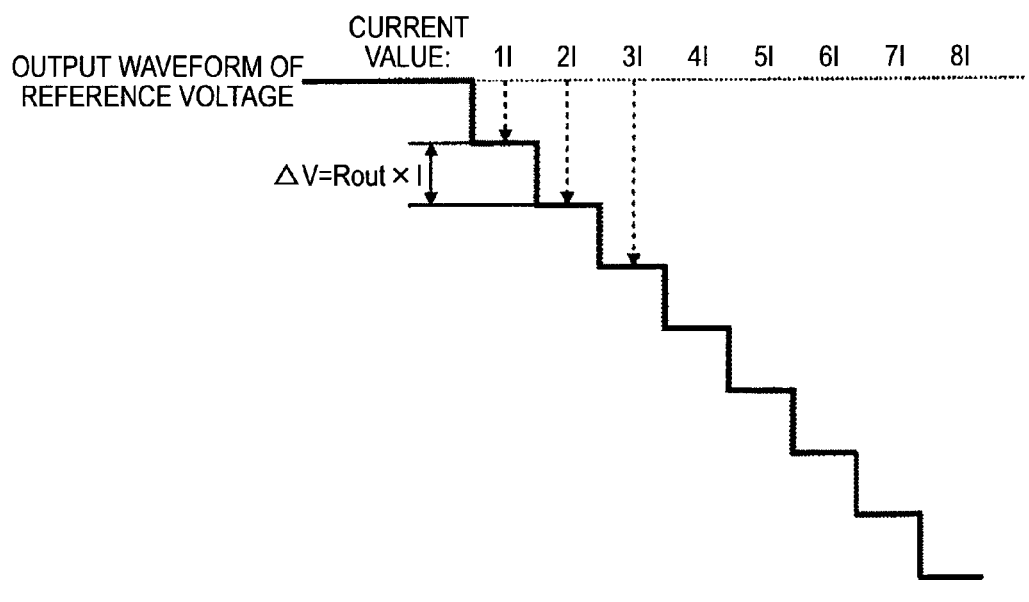
FIG. 12 is a diagram illustrating a variation of a reference signal (voltage) with the lapse of time.

FIG. 12 is a diagram illustrating a variation of the reference signal (voltage) with the lapse of time.

The reference signal (voltage) RAMP has an output waveform in which it increases by a current I every predetermined time as shown in FIG. 12.

At this time, a voltage drop ΔV for each predetermined time is Rout×I. By repeating this voltage drop, it is possible to generate the reference signal (voltage).

To increase the slope of the reference signal (voltage), the current I can be increased or the time interval for increasing the current I can be shortened.

Figure 13:
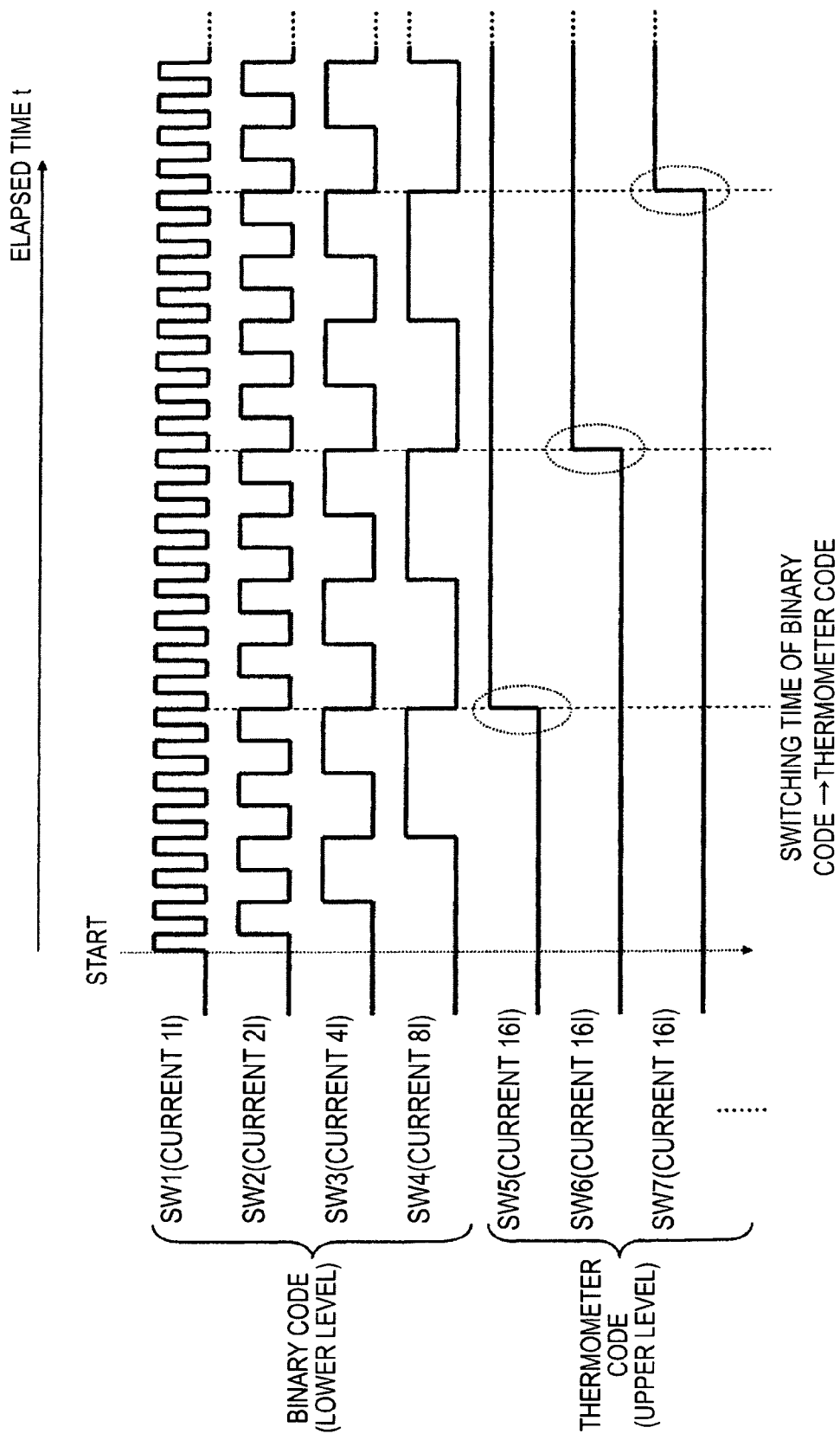
FIG. 13 is a timing diagram illustrating a switch control of the DAC shown in FIG. 10.

To output the reference voltage to the DAC 200 shown in FIG. 10, a SW control should be performed as shown in FIG. 13.

FIG. 13 is a timing diagram illustrating a switch control of the DAC shown in FIG. 10.

At the time of starting the generation of the reference signal (voltage), all the switches SW2-1 to SW2-N are turned off and the switches SW2-1 to SW2-N are switched with the lapse of time.

The switches SW2-1 to SW2-4 controlling the binary code are controlled in a toggle control manner in which they are repeatedly switched between High (H) and Low (L), and the switches SW2-5 to SW2-N controlling the thermometer code are controlled in a monotonous manner in which they are switched only from L to H.

The transfer from the binary code to the thermometer code uses the time when all the switches in the binary code are changed to H as a trigger and is embodied by setting one switch in the thermometer code to H and setting all the switches in the binary code to L at the next time.

The 4-bit binary code is configured in FIG. 10, but this is only an example. The control itself is not changed even when the number of bits is changed.

In the first configuration according to this embodiment, a current source (mechanism) allowing a settling current to flow is added to the DAC 200 having the above-mentioned configuration.

Figure 14:
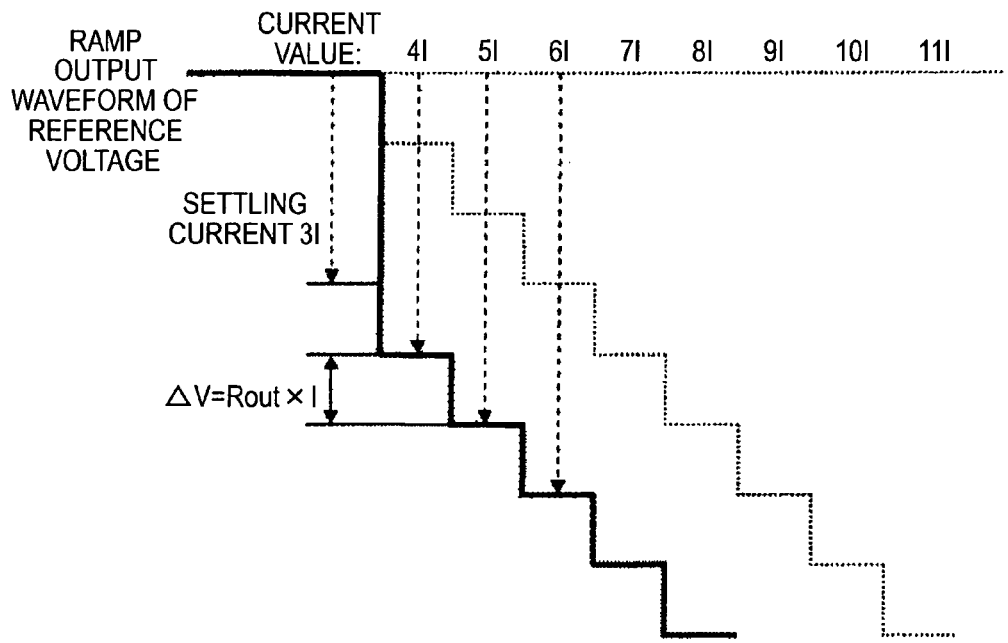
FIG. 14 is a diagram illustrating an example of a waveform of the reference signal (voltage) when a settling-current current source is added.

FIG. 14 is a diagram illustrating an example of a waveform of the reference signal (voltage) when the current source allowing the settling current to flow is added.

In FIG. 14, an example of a waveform with a settling current of 3I is shown, which is different from FIG. 12 only in the current at the time of starting and which is equal thereto in the slew rate.

That is, a mechanism for adjusting the current at the time of starting the generation of the reference signal (voltage) RAMP without changing the slew rate is necessary. The current is adjusted depending on the slope when the slope of the reference signal (voltage) RAMP is changed.

Figure 15:
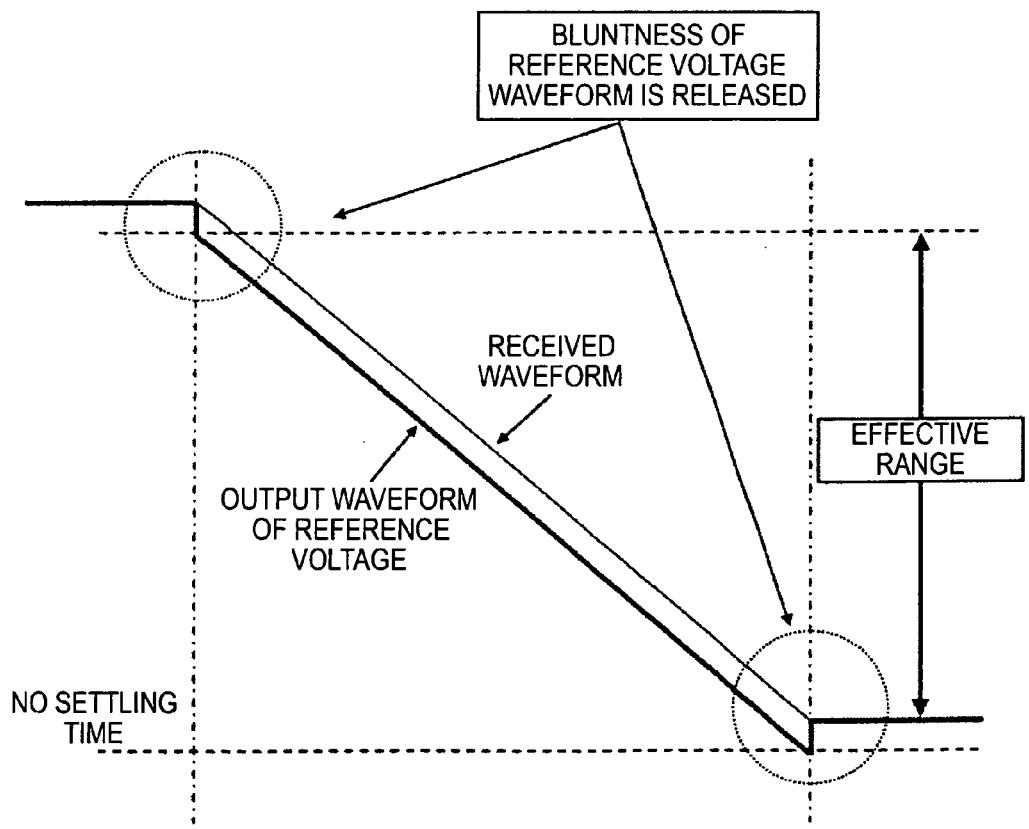
FIG. 15 is a diagram schematically illustrating the reference signal (voltage) when a settling-current current source is added.

FIG. 15 is a diagram schematically illustrating the reference signal (voltage) when the current source allowing a settling current to flow is added.

As shown in FIG. 15, by adding the current source allowing a settling current to flow, it is possible to solve the problem with the bluntness of the reference voltage and to greatly improve the setting time accordingly.

Here, as the set value of the settling current deviates from an ideal value, the settling time STL also increases in proportion thereto. Accordingly, it is an important point what optimal current value should be set.

A method of adjusting the current at the time of starting the generation (output) of the reference signal (voltage) RAMP will be described below.

In a first method, a method of adding a function to a logic circuit controlling the switches SW of the current source for the generation of the reference signal (voltage) can be used.

As shown in the timing diagram of FIG. 13, all the switches SW are typically set to L at the start time. However, by adding a function of starting from any state of the switches SW, the current value at the time of starting the generation of the reference signal (voltage) can be set to any value.

Figure 16:
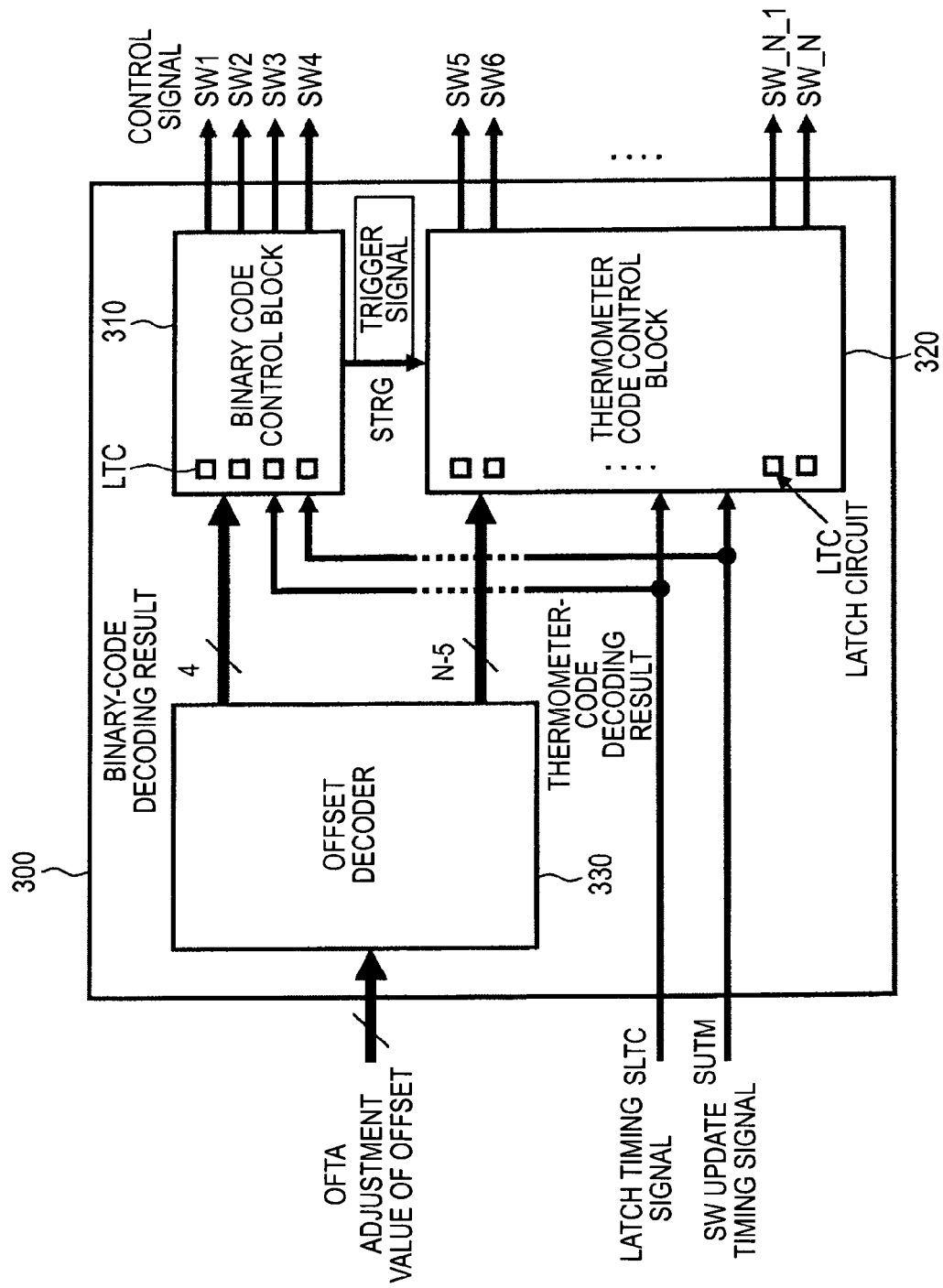
FIG. 16 is a diagram illustrating a logic circuit controlling switches of a reference-signal (voltage) generating current source in which a function of starting from any switch state is added.

FIG. 16 is a diagram illustrating a logic circuit controlling the switches of the current source for the generation of the reference signal (voltage) in which the function of starting from any switch state is added.

The logic circuit 300 shown in FIG. 16 includes a binary code control block 310, a thermometer code control block 320, and an offset decoder 330.

A trigger signal STRG for change from the binary code to the thermometer code is used in the binary code control block 310 and the thermometer code control block 320.

A timing signal SUTM for updating the switches SW is input to both control blocks 310 and 320 and the trigger signal STRG is changed to H when all the switches of the binary code are changed to H.

When the control of the switches SW is not performed every predetermined time, the slew rate varies. Accordingly, a masked block is used as the SW updating timing signal SUMT.

To start from any state of the switches SW, a dedicated decoder 330 decoding a set offset adjustment value OFTA with the binary code and the thermometer code and latch circuits LTC storing the decoding results in the control blocks 310 and 320 are necessary.

The latch circuits LTC should be provided to correspond to the number of switches SW and latch the decoding results corresponding to the switches SW when the latch timing signal SLTC is input.

The decoded values should be latched at the same time as starting the generation of the reference signal (voltage) RAMP. After the latching, it is possible to give an offset to the reference signal (voltage) RAMP by performing the same switch SW control.

Figure 17:
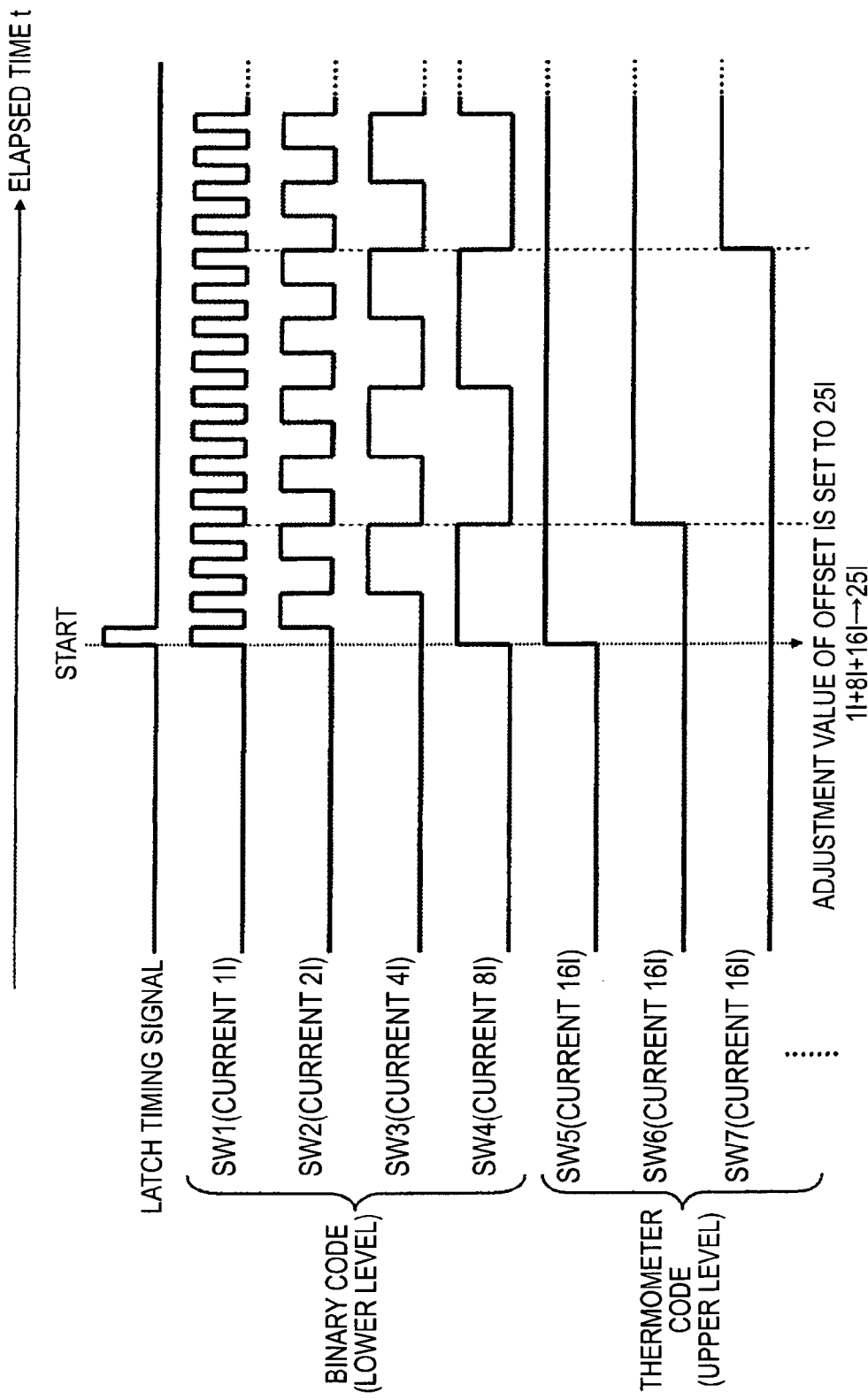
FIG. 17 is a timing diagram of the logic circuit shown in FIG. 16.

FIG. 17 is a timing diagram of the logic circuit shown in FIG. 16.

FIG. 17 shows an example where the offset adjustment value OFTA is set to 24I.

In the typical switch SW control, all the switches SW are first set to L. However, in this case, when the latch timing signal SLTC is changed to H, that is, when the generation of the reference signal RAMP is started, the switches SW2-1, SW2-4, and SW2-5 are simultaneously changed to H in parallel and the control is started from the current value of 25I.

This offset current serves as the settling current, whereby the improvement of the settling time is caused. Thereafter, the switch SW control is performed so as to increase the current by I every predetermined time as described above.

In this method, the current source for the generation of the reference signal (voltage) is used as the settling current source. Accordingly, the number of current sources to be used for the generation of the reference signal may be reduced. When the offset adjustment value OFTA increases, it is necessary to prepare for extra current sources.

In a second method, a dedicated current source is provided as a settling current source.

In the above-mentioned first method, the logic circuit should be greatly modified and the configuration may be complicated due to the addition of the latch circuits. Accordingly, the function can be more easily added by employing the circuit configuration including a dedicated current source cell.

Since a current source smaller than the minimum current source I for the generation of the reference signal (voltage) can be provided, it is possible to enhance the resolution of the settling current.

Figure 18:
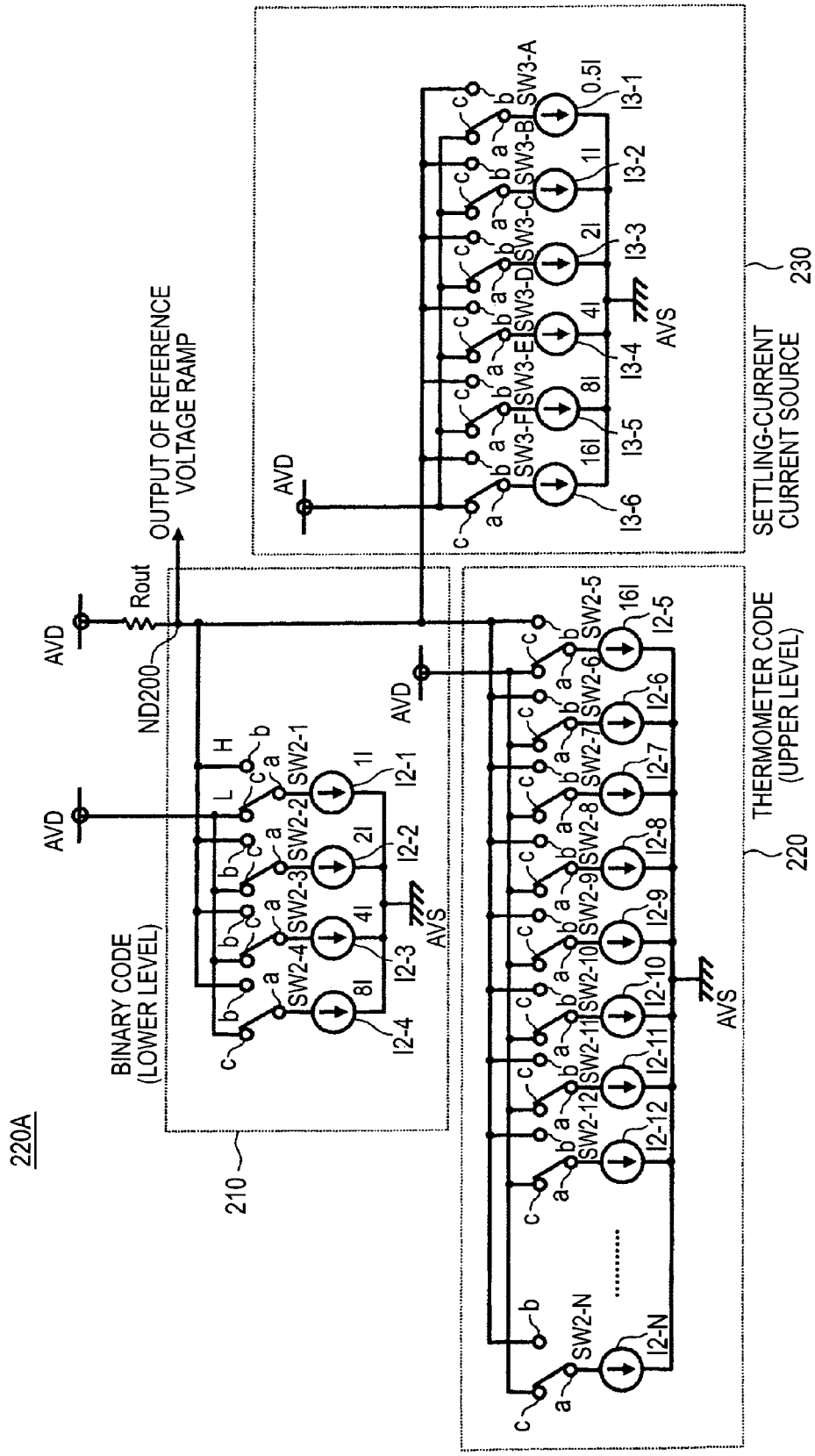
FIG. 18 is a diagram illustrating an example where a settling-current current source is added to the configuration of the reference signal generating circuit shown in FIG. 10.

FIG. 18 is a diagram illustrating an example where a settling-current current source is added to the configuration of the reference signal generating circuit shown in FIG. 10.

The settling-current current source 230 includes current sources I3-1 to I3-6 and switches SW3-A to SW3-F.

The current sources I3-1 to I3-6 are configured to have current supply capacities of 0.5I, 1I, 2I, 4I, 8I, and 16I.

Each of the switches SW3-A to SW3-F switches the electrical connection between terminal a and terminal b or c.

The current sources I3-1 to I3-6 are connected between terminals a of the switches SW3-A to SW3-F and a reference potential AVS.

Terminal b of each of the switches SW3-A to SW3-F is connected to the output node ND200 of the reference signal (voltage) RAMP. The output node ND200 is connected to a power source AVD via the output resistor Rout.

Terminal c of each of the switches SW3-A to SW3-F is connected to the power source AVD.

The minimum current source cell for the settling current is set to 0.5I, but a smaller current source may be provided. The size or the number of current sources needs to be determined on the basis of the settling current and depends on the specification of the slew rate of the reference signal (voltage) RAMP or the line load.

The above-mentioned operations can be applied to the thermometer code and the binary code without any problem and a function of validating the setting-current current source 230 in parallel at the same time as starting the generation of the reference signal RAMP is necessary.

Which current source should be set to H can be set up from the outside, for example, through the use of a register.

Figure 19:
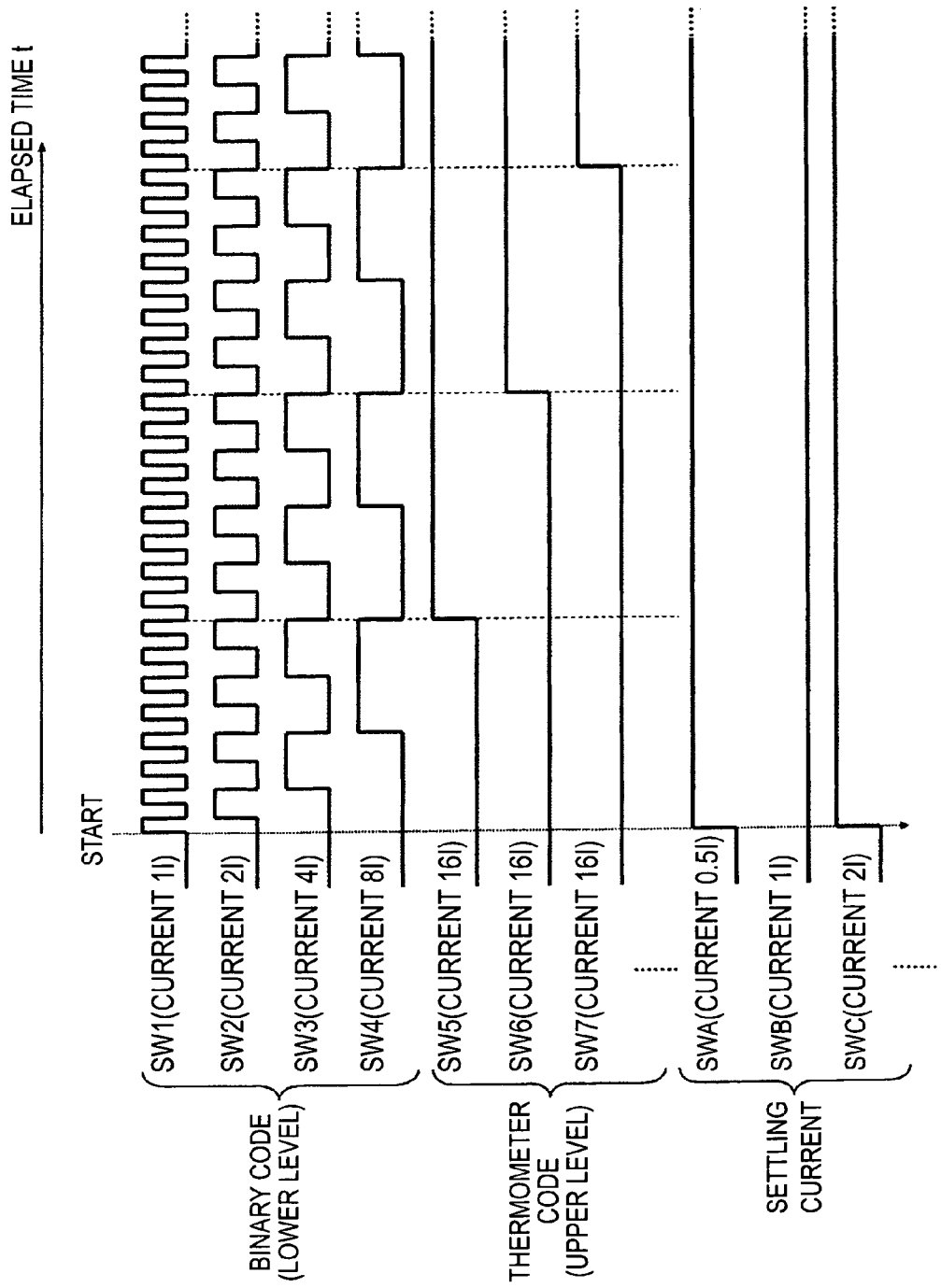
FIG. 19 is a timing diagram of the reference signal generating circuit shown in FIG. 18 in which the settling-current current source is added thereto.

FIG. 19 is a timing diagram of the reference signal generating circuit shown in FIG. 18 in which the settling-current current source is added thereto.

The timing signals of the binary code section 210 and the thermometer code section 220 are the same as shown in FIG. 13.

Accordingly, since the existing circuit configuration can be utilized, the addition of a function is facilitated. In the control of the switches SW3-A to SW3-F of the settling-current current source 230, the switches are set to H or L in parallel at the same time as starting the generation of the reference signal RAMP and the switch states are not changed any more thereafter.

When the period of the reference signal (voltage) is ended, a process of clearing the switches (returning the switches to L) is performed.

Figure 20:
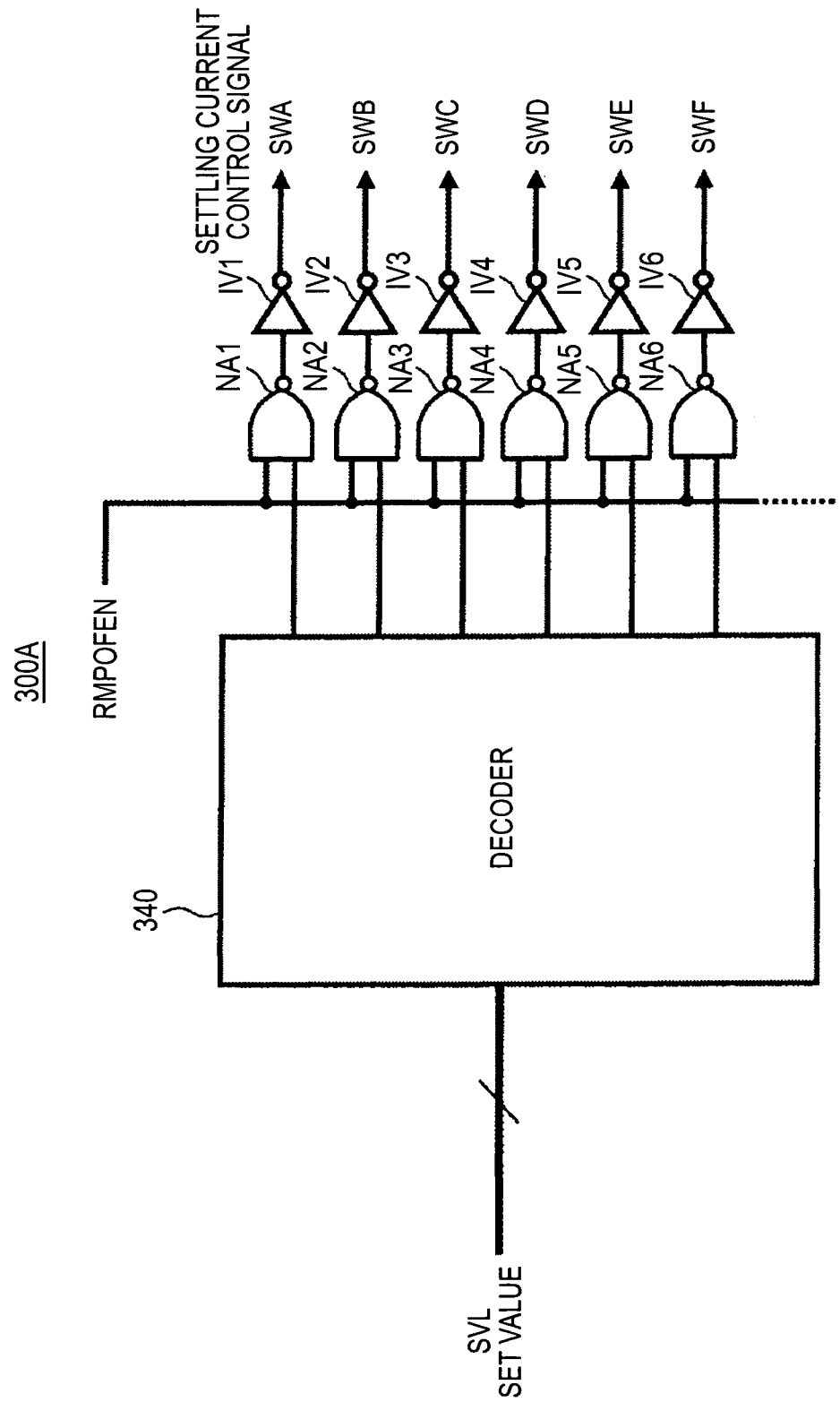
FIG. 20 is a diagram illustrating a logic circuit controlling switches of the settling-current current source in the reference signal (voltage) generating circuit shown in FIG. 18.

FIG. 20 is a diagram illustrating a logic circuit controlling the switches of the settling-current current source in the reference signal (voltage) generating circuit shown in FIG. 18.

The logic circuit 300A includes a decoder 340, NAND gates NA1 to NA6 for masking the control signals SWA to SWF of the switches SW3-A to SW3-F of the settling current current source 230, and inverters IV1 to IV6 outputting the control signals SWA to SWF.

In the logic circuit 300A, the value SVL set through the use of a register or the like is decoded by the dedicated decoder 340 and the decoded value is used as the control signals SWA to SWF of the settling-current current source.

The control signals SWA to SWF are masked with an enable signal RMPOFEN and are changed to H at the same time as starting the generation of the reference signal RAMP, whereby the current application time is obtained.

In another method of adding the dedicated current source for the settling current, the number of current sources to be added is set to be small and the current values therebetween are compensated for by adjusting a back-bias voltage of a transistor.

By using this method, it is possible to reduce the number of current sources and to suppress the increase in circuit size. An exemplary configuration thereof is shown in FIG. 21.

Figure 21:
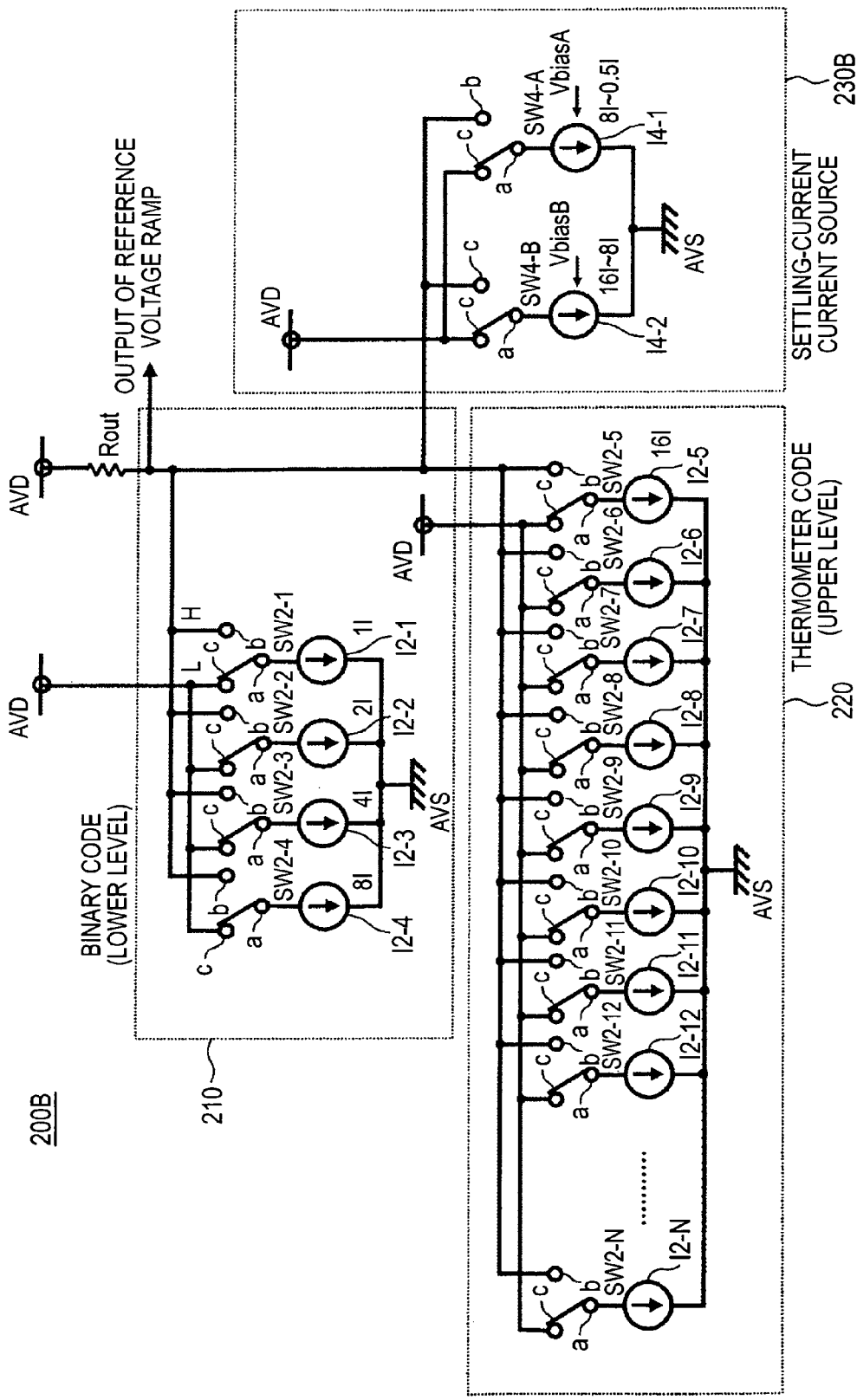
FIG. 21 is a diagram illustrating an example where the configuration of the settling-current current source shown in FIG. 18 is simplified.

FIG. 21 is a diagram illustrating an example where the configuration of the settling-current current source shown in FIG. 18 is simplified.

In FIG. 21, two settling current sources I4-1 and I4-2 and two switches SW4-A and SW4-B are added to the settling-current current source 230B and the current ranges of the current sources are defined as a range of 0.5I to 8I and a range of 8I to 16I, respectively.

The configuration of the current sources is the same as shown in FIG. 11 and the current is adjusted by adjusting the back-bias voltage of the transistor M2 shown in FIG. 11 to change the threshold voltage thereof.

The level of the back-bias voltage can be generated by a resistor array and a voltage can be applied by the switching of the switches SW.

Figure 22:
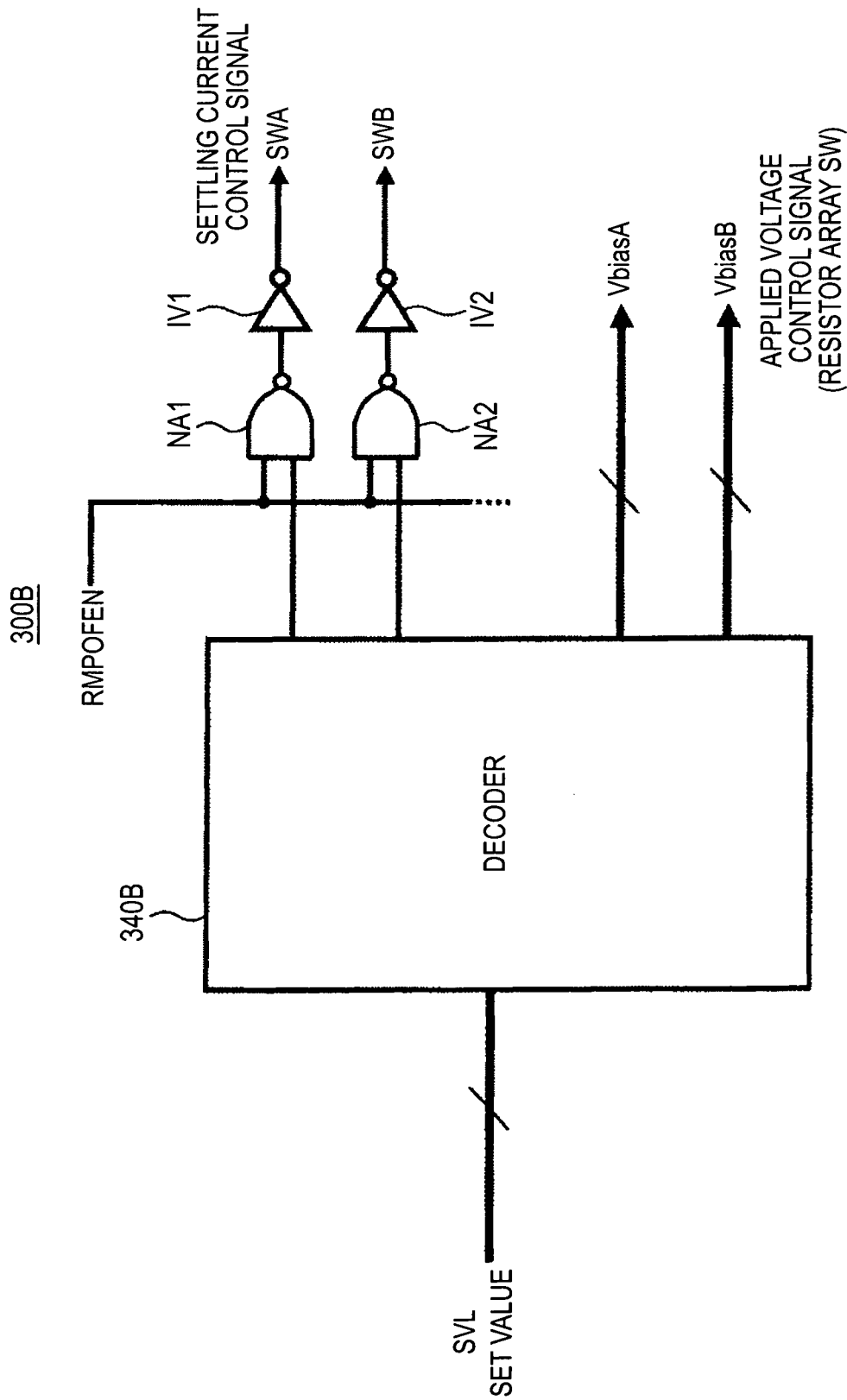
FIG. 22 is a diagram schematically illustrating a logic circuit controlling switches of the settling-current current source in the reference signal (voltage) generating circuit shown in FIG. 21.

FIG. 22 is a diagram schematically illustrating a logic circuit controlling the switches of the settling-current current source in the reference signal (voltage) generating circuit shown in FIG. 21.

As in the circuit configuration shown in FIG. 20, the value set through the use of the register or the like is decoded by a dedicated decoder 340B but this circuit configuration is different from the above-mentioned circuit configuration, in that control signals VbiasA and VbiasB for adjusting the level of the back-bias voltage are added thereto.

The timing signals for applying a current are the same as shown in FIG. 19 and are controlled by the use of an enable signal RMPOFEN.

In the above-mentioned method of adding a dedicated current source, a difference may occur between the time of starting the generation of the reference voltage and the time of applying the settling current.

When blocks generating two timing signals are different from each other and when the blocks are the same but the line loads at both times are different greatly, the difference in timing may be caused.

When the difference in timing occurs, the later application of a settling current may cause the deterioration of the settling time and the earlier application of a settling current may not cause the acquisition of a desired reference voltage.

Figure 23:
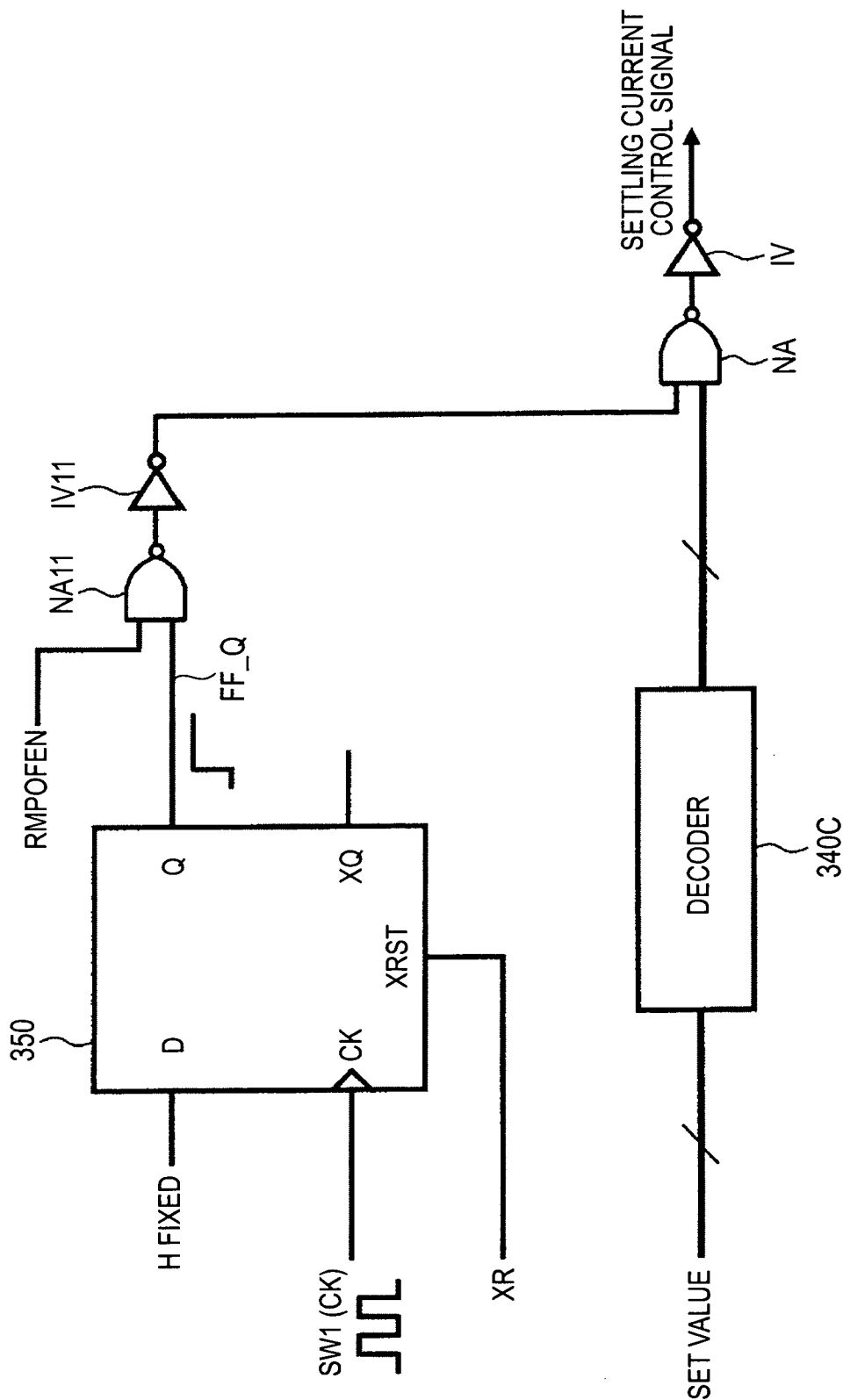
FIG. 23 is a diagram illustrating an example of a logic circuit on which a countermeasure against a difference in timing is carried out.

FIG. 23 is a diagram illustrating an example of a logic circuit on which a countermeasure against the difference in timing is carried out.

The logic circuit 300C has a configuration in which a flip flop circuit 350 synchronizing both timing signals is added to the logic circuits 300A and 300B shown in FIGS. 20 and 22.

The synchronization is made by inputting the control signal of the switch SW2-1 in FIG. 19 to a terminal CLK of the flip flop circuit 350 and performing a NAND operation on the output FF_Q of the flip flop circuit 350 and the current application timing signal RMPOFEN by the use of the NAND gate NA11.

Figure 24:
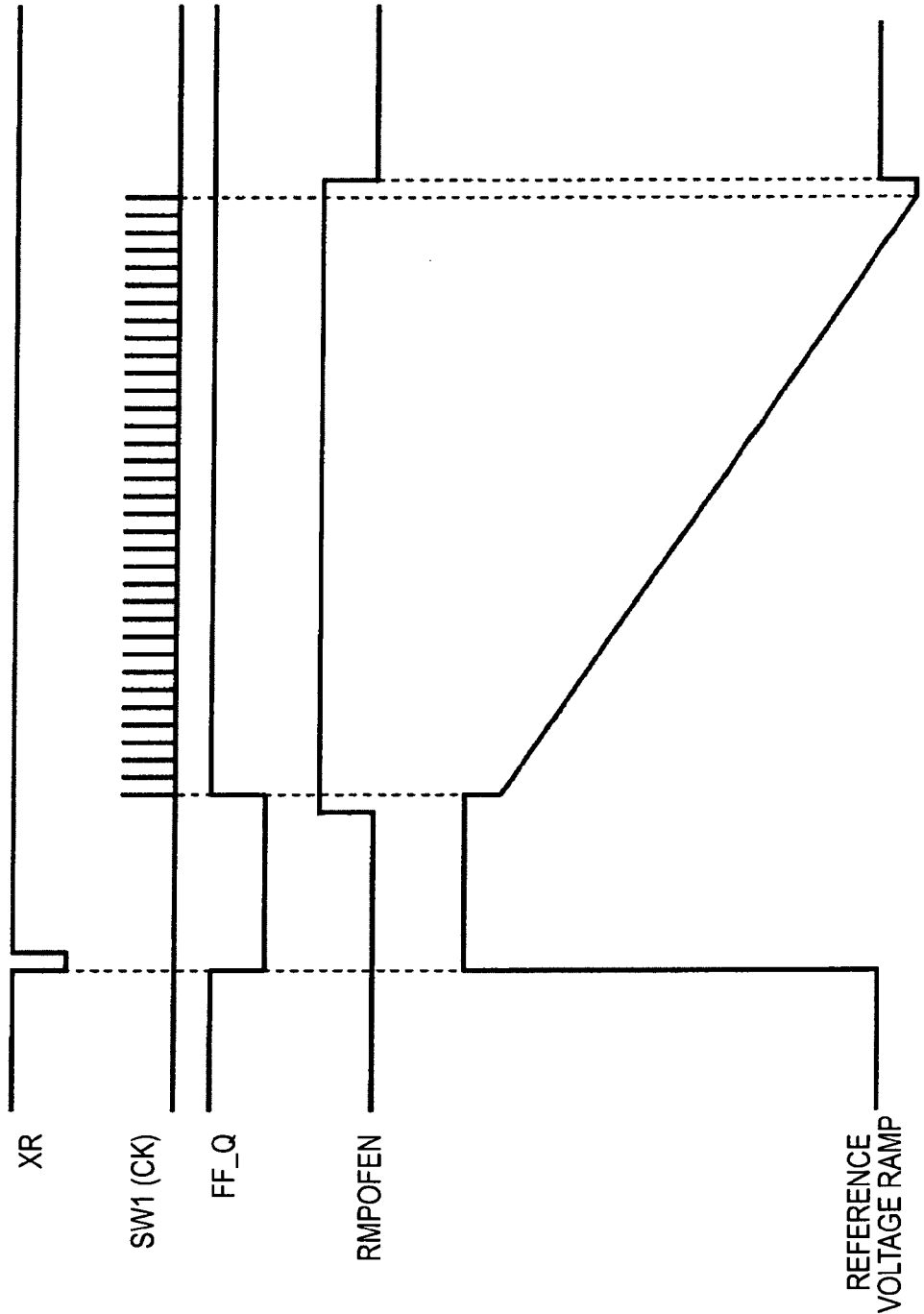
FIG. 24 is a timing diagram illustrating the control of the logic circuit shown in FIG. 23.

FIG. 24 is a timing diagram illustrating the control of the logic circuit shown in FIG. 23.

Reference sign XR represents a reset signal of the reference signal (voltage) RAMP and the flip flop circuit 350 also is reset simultaneously when the reset signal XR is changed to L (Low).

At this time, the output FF_Q of the flip flop circuit 350 is changed to L (low). The application timing signal RMPOFEN of the settling current is set to H (High) earlier than the actual application time.

When the generation of the reference signal RAMP is started, the control signal SW1 is changed from L to H and thus the output FF_Q of the flip flop circuit 350 is changed to H.

As a result, the value of the decoder 340C is reflected in the settling current control signal and it is thus possible to generate the reference signal (voltage) RAMP without a difference in timing as shown in FIG. 24.

A system capable of changing the slope of the reference signal (voltage) RAMP will be described below.

In many cases, the slope of the reference voltage output from the DAC 161 (200) can be freely set.

In the current source shown in FIG. 11, it is possible to change the slope of the reference signal RAMP by changing the value of the reference current Iref and changing $\Delta V$ shown in FIG. 12.

At the time of changing the slope, it is necessary to adjust the settling current accordingly. This is because the deterioration of the settling is caused when the settling current is not set to correspond to the slope, that is, the slew rate.

Typically, it is necessary to reset the settling current whenever changing the slope. A configuration of automatically adjusting the settling current will be described below.

Figure 25:
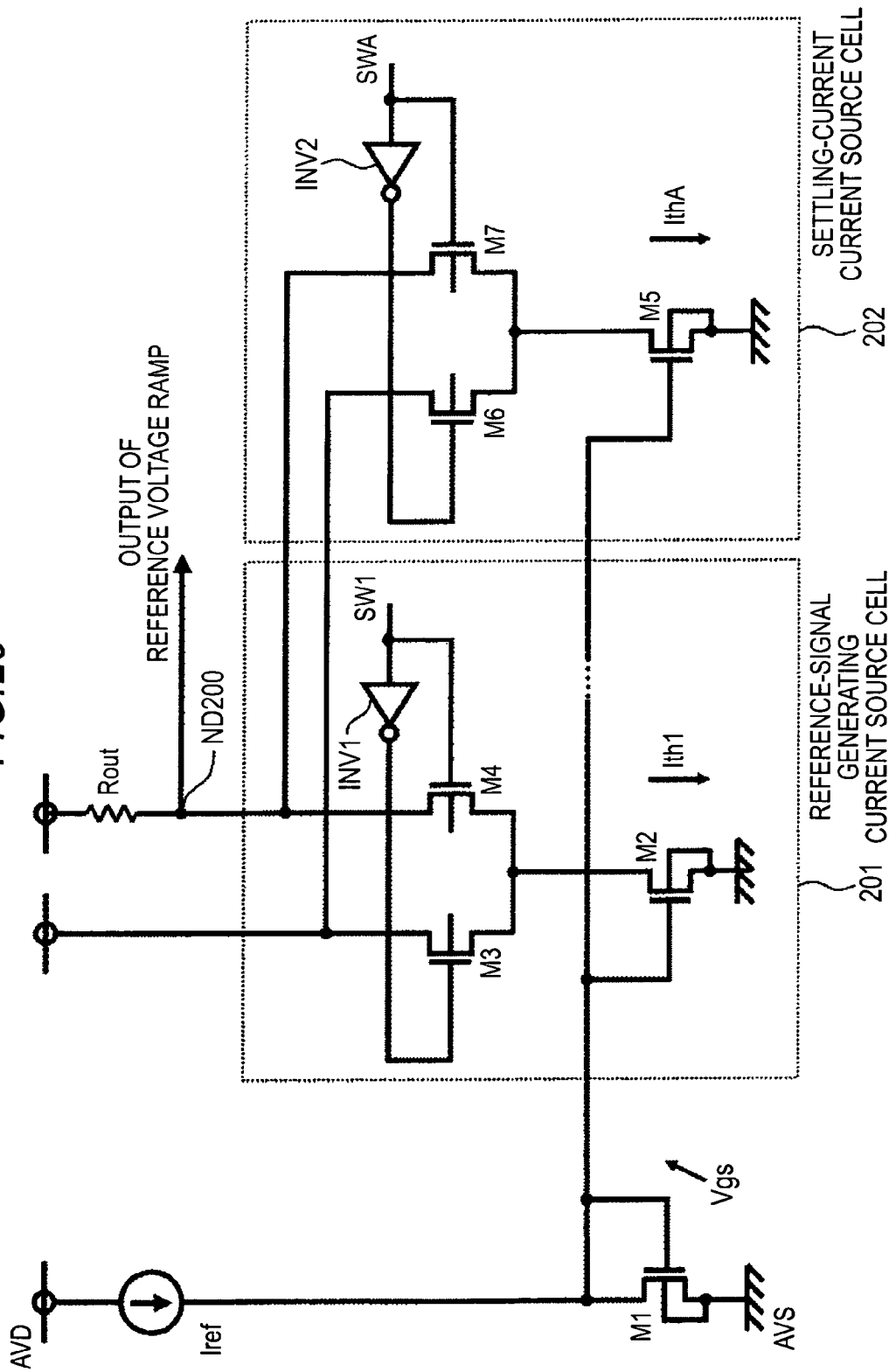
FIG. 25 is a circuit diagram illustrating the configuration of a current source configured to automatically adjust a settling current.

FIG. 25 is a circuit diagram illustrating the configuration of a current source configured to automatically adjust a settling current.

The current source shown in FIG. 25 has a configuration in which a settling-current current source 202 is added to the reference-voltage generating current source 201 shown in FIG. 11.

The settling-current current source 202 includes transistors M5 to M7 and an inverter INV2.

As shown in FIG. 25, both current sources 201 and 202 share a gate voltage (Vgs) and can thus transfer the variation of the reference current Iref to the settling current.

When the slope of the reference signal RAMP is reduced to a half, the current Ith1 flowing in the transistor M2 can be reduced to a half by reducing the reference current Iref to a half and lowering the gate voltage Vgs.

Here, since the gate voltage is common, the current Ith2 flowing in the settling-current transistor M5 is simultaneously reduced to a half.

Of course, it is necessary to cause the transistors M2 and M5 to operate in a saturated region.

It has been described that the settling current depends on the line load parasitic on the RAMP line, but such a factor varies in value depending on the manufacturing variations or the temperature conditions and thus it is difficult to define the optimal value common to all chips.

Therefore, there is a need for a system detecting the optimal value. The configuration of such a system will be described below. A configuration of detecting the linearity of the reference signal (voltage) RAMP is provided to detect the optimal settling current in real time.

Figure 26:
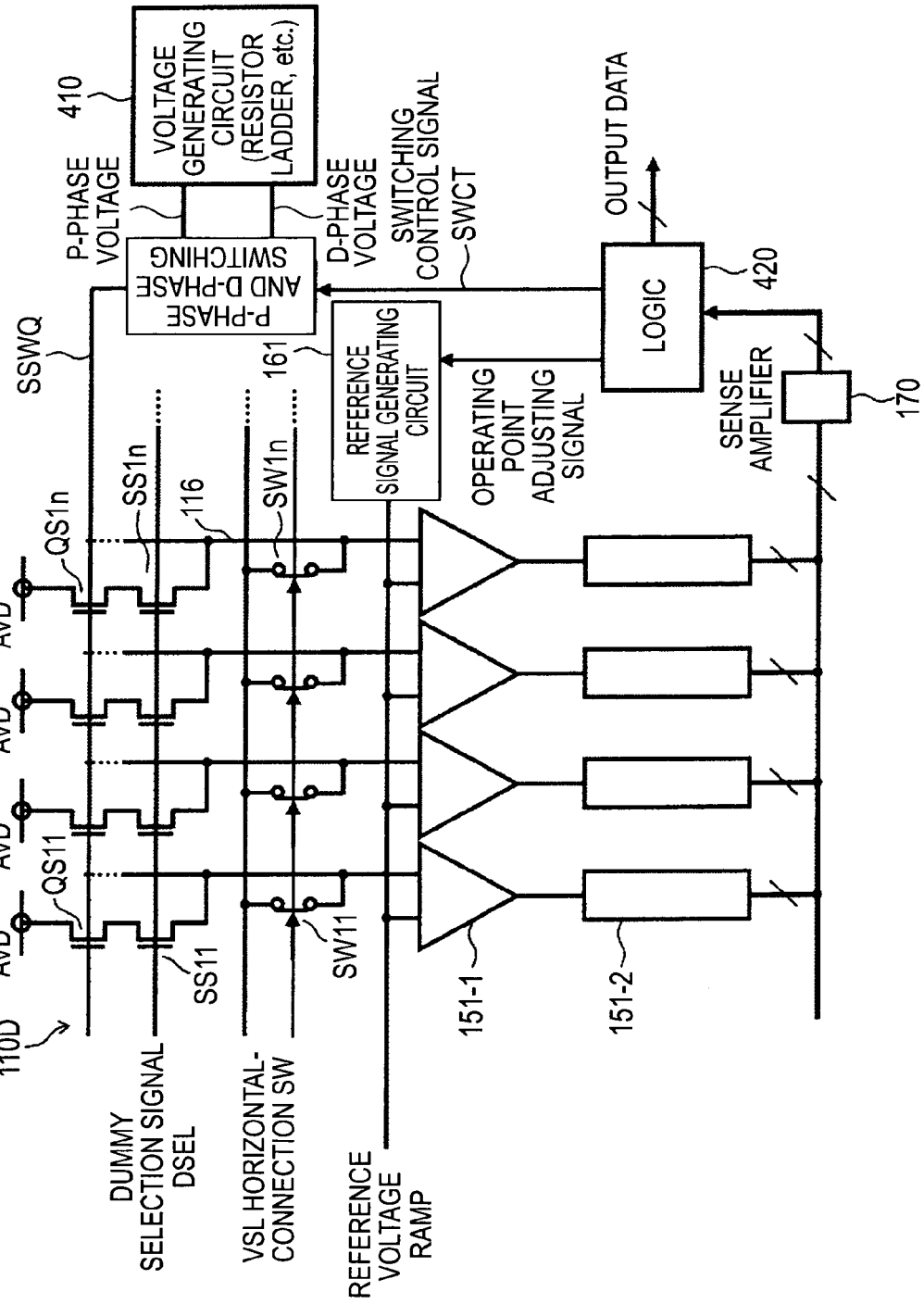
FIG. 26 is a diagram illustrating the configuration of a detection system detecting linearity of a reference signal (voltage) so as to detect the optimal settling current in real time.

FIG. 26 is a diagram illustrating the configuration of a detection system detecting the linearity of a reference signal (voltage) RAMP so as to detect the optimal settling current in real time.

The basic configuration of the detection system 400 is the same as the parallel-column AD converter shown in FIG. 7 and it further includes dummy pixels 110D used to input a voltage to the vertical signal line 116 (VSL) from the outside.

The application voltage to the dummy pixels 110D is generated from a voltage generating circuit 410. The voltage generating circuit 410 includes a resistor ladder.

The voltage generating circuit 410 can generate P-phase and D-phase voltages independently and switches the voltage level on the basis of a switching control signal SWCT from a logic 420.

Switches QS11 to QS1$n$ and selection switches SS11 to SS1$n$, each of which is made up of a transistor, are connected in series between the vertical signal lines 116 and the power source AVD.

The gates (control terminals) of the switches QS11 to QS1$n$ are supplied with a P-phase and D-phase switching signal SSWQ set to the P-phase or D-phase voltage level based on the switching control signal SWCT.

The gates (control terminals) of the selection switches SS11 to SS1$n$ are supplied with a dummy selection signal DSEL.

By employing this configuration, a voltage can be set as the voltage VSL of the vertical signal line 116. However, since the voltage is input via the dummy pixels 110D, the voltage is influenced by the variations of the dummy pixels in any way.

To alleviate the influence, the configuration of VSL horizontal-connection switches (common-connection switches) SW11 to SW1$n$ connecting the vertical signal lines 116 is provided. The gates (control terminals) of the VSL horizontal-connection switches SW11 to SW1$n$ are supplied with a VSL horizontal-connection control signal SLVSL.

At the time of detecting the linearity error of the reference signal RAMP, the switches SW11 to SW1$n$ are tuned on to connect the vertical signal lines 116 to a predetermined line LNE, thereby absorbing the influence of inter-column errors. On the contrary, this function is deactivated in normal operations.

It is determined on the basis of the linearity characteristic of the reference signal (voltage) RAMP whether the settling current deviates from the optimal value.

To measure the linearity, plural voltages are applied as the voltages VSL of the vertical signal lines 116 using the dummy pixels 110D and the voltage generating circuit 410. At this time, it should be noted that the gain of the dummy pixels 110D is accompanied.

Figure 27:
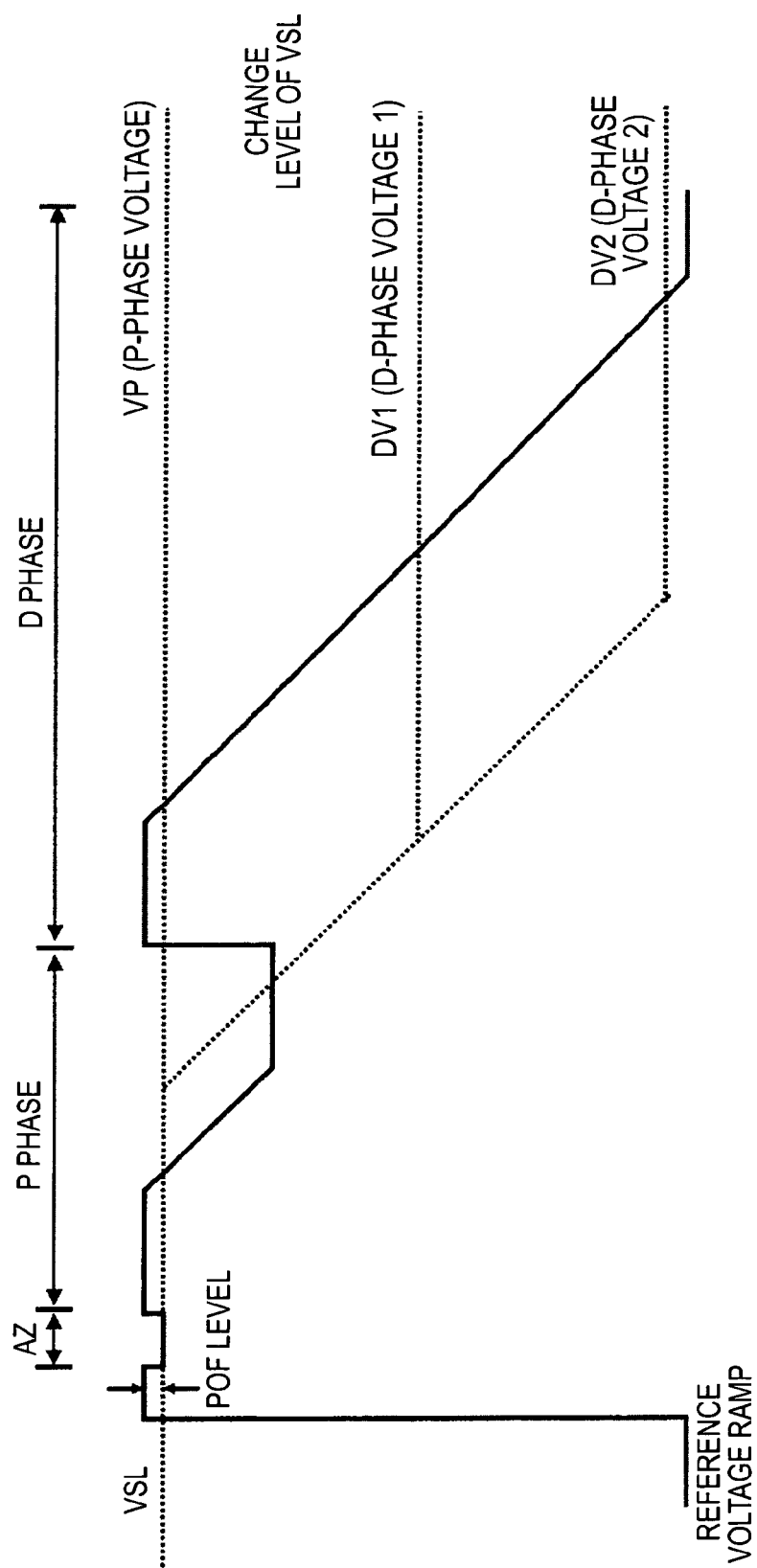
FIG. 27 is a diagram illustrating a measured image of a linearity characteristic of a reference signal.

FIG. 27 is a diagram illustrating a measured image of the linearity characteristic of the reference signal.

The P-phase voltage serves as a reference and thus is not updated, but only the D-phase voltage is updated every predetermined period of time (for example, 1H).

The voltage levels of a first D-phase voltage DV1 and a second D-phase voltage DV2 are points used to generate an ideal line and a P-phase voltage VP is a point used to detect the deviation from the ideal line. The linearity error is calculated from the output data of the points having been subjected to the CDS process.

At this time, the precision can be enhanced by setting a POF level in an auto zero (AZ) period to be shallow (so as not to give an offset), but the p phase should not be excluded.

Since two points in level of the D-phase voltage have to be completely settled, the first D-phase voltage VD1 is set to the vicinity of the middle part of the reference signal RAMP and the second D-phase voltage DV2 is set to the vicinity of the last part of the reference signal RAMP.

The acquired data is stored in a memory of the logic block.

A procedure of calculating a linearity error from the acquired data will be described below.

Figure 28:
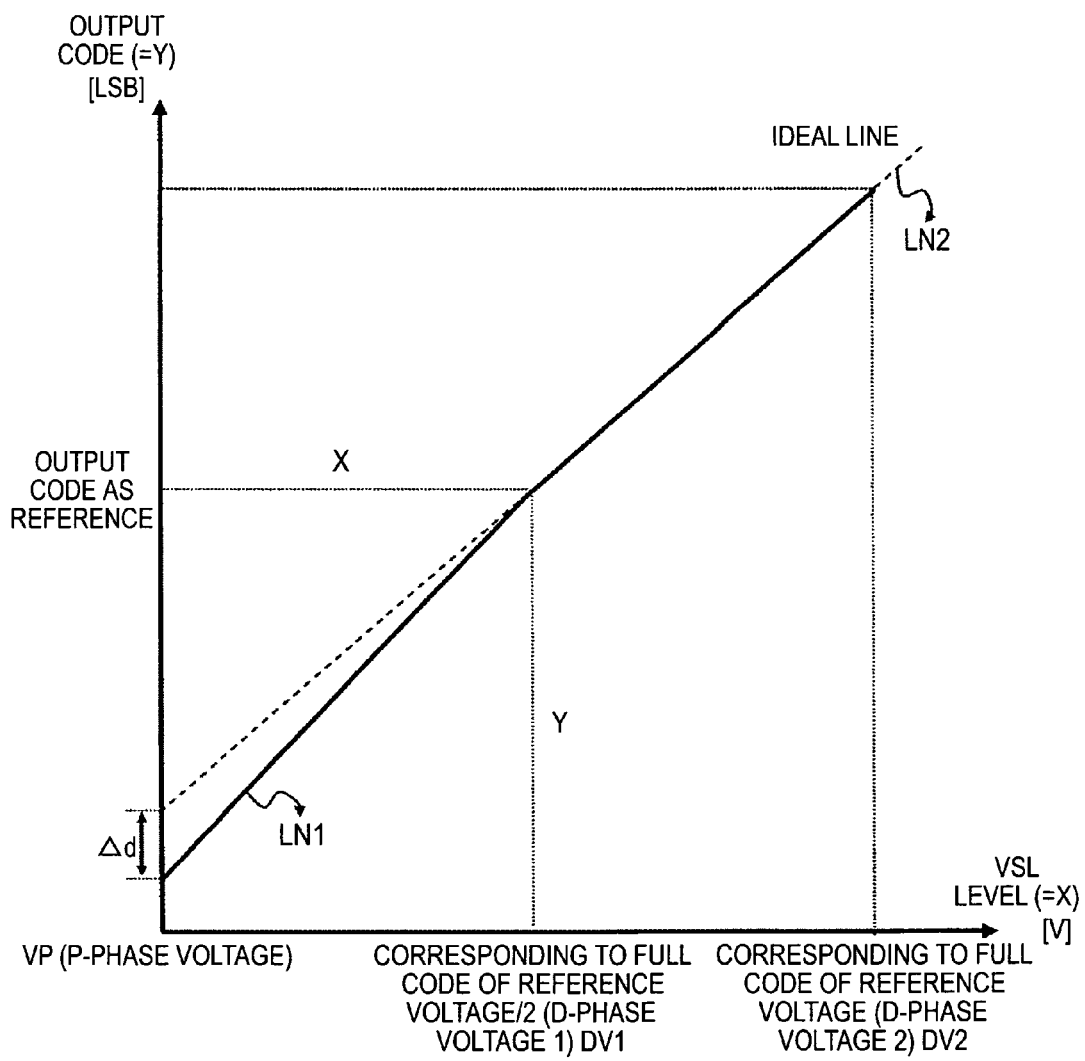
FIG. 28 is a diagram conceptually illustrating a procedure of calculating a linearity error from acquired data.

FIG. 28 is a diagram conceptually illustrating the procedure of calculating a linearity error from the acquired data.

In the graph shown in FIG. 28, the horizontal axis represents the VSL level, that is, the voltage levels in the P phase and the D phase, and the vertical axis represents an output code.

The data sequentially acquired as shown in FIG. 27 can be plotted to a line indicated by reference sign LN1.

Actually, the graph is a smooth curve in the period between the P-phase voltage and the full code of the reference signal (voltage) RAMP/2 but data is not acquired in the meantime. Accordingly, the straight line shown in FIG. 28 is obtained.

The ideal line LN2 is calculated from the acquired data.

The ideal line LN2 is obtained by connecting the output codes of two points of the full code of the reference signal RAMP/2 and the full code. The difference (=Δd) of the ideal line LN2 from the output code of the P-phase voltage is defined as a linearity error.

When the settling current deviates from the optimal value, the output code of the P-phase voltage VP deviates from the ideal line LN2 and thus the linearity error increases. On the basis of the linearity error, it is determined whether it is necessary to adjust the settling current.

In the procedure, the processes of measuring the linearity and adjusting the current value are repeatedly performed until the threshold value of the linearity error is satisfied. Details thereof will be described later.

FIG. 29 is a diagram illustrating an example of a memory management method in a logic block.

The relative value of the reference signal (voltage) to the reset level is input to the voltage level.

When the set value of the voltage generating circuit 410 corresponds to the relative value of the reference signal to the reset value, the set value is used.

The data acquired as described above is stored in the output code. The ideal line LN2 is calculated using the stored data.

The slope CLN of the ideal line LN2 passing through two points of the first D-phase voltage VD1 and the second D-phase voltage VD2 in FIG. 28 can be calculated from the following expression.

$CLN$(slope)=(difference in output code between $D$-phase voltages $DV1$ and $DV2$)/(difference in $VSL$ voltage level between $D$-phase voltages $DV1$ and $DV2$)

In the example shown in FIG. 29, the slope is CLN=3000/100=30 and the ideal line LN2 is Y=30X+300.

By inputting the VSL voltage level of the P-phase to X of this ideal line, the data (=450) of the ideal line of the P phase is obtained. The difference between the data of the ideal line and the output code of the P phase is the linearity error. In the example shown in FIG. 29, the linearity error is 300.

The logic block controlling the CMOS image sensor shown in FIG. 26 is formed in the signal processing circuit 180 shown, for example, in FIG. 6.

Figure 30:
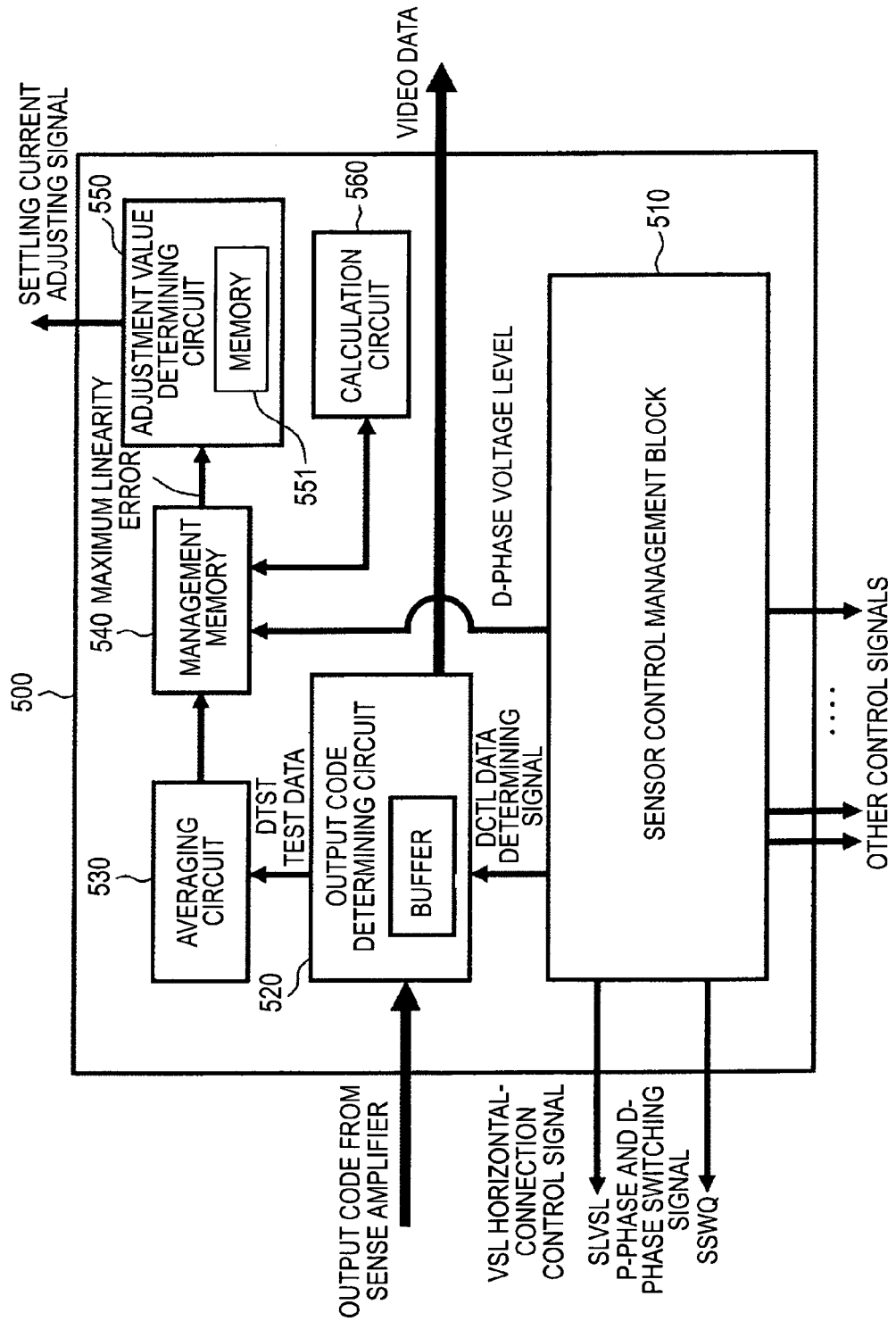
FIG. 30 is a diagram illustrating the configuration of a logic block controlling a CMOS image sensor shown in FIG. 26.

FIG. 30 is a diagram illustrating the configuration of the logic block controlling the CMOS image sensor shown in FIG. 26.

The logic block 500 shown in FIG. 30 includes a sensor control management block 510, an output code determining circuit 520, an averaging circuit 530, a management memory 540, an adjustment value determining circuit 550, a calculation circuit 560.

In the logic block 500, the whole sensor is controlled by the use of the sensor control management block 510 and the VSL horizontal-connection control signal SLVSL and the P-phase and D-phase switching signal SSWQ are also controlled by the use of the sensor control management block 510.

Since the adjustment of the settling current is not performed at the time of normal imaging, the adjustment can be optimally performed by the sensor control management block 510 managing the operational conditions of the sensor.

The output code from the sense amplifier 170 is transmitted to the output code determining circuit 520.

The output code determining circuit 520 determines whether the transmitted data is image sensed data or data acquired for the adjustment of the settling current. A control signal DCTL for the determination is received from the sensor control management block 510.

The image sensed data is output without any change and the test data DTST acquired for the adjustment of the settling current is transmitted to the averaging circuit 530.

Since the test data DTST is acquired using plural dummy pixels at a distal end for one voltage level (is output from plural columns), the average value of the test data is calculated by the averaging circuit 530.

This is because when the test data is acquired from one dummy pixel, the value can be greatly deviated due to the influence of noise or column differences. The result from the averaging circuit 530 is stored in the management memory 540 at the subsequent stage. The details stored in the management memory 540 correspond to FIG. 29.

The calculations of the slope of the ideal line LN2 or the linearity error shown in FIG. 29 are all performed by the calculation circuit 560.

The data necessary for the calculation circuit 560 is transmitted from the management memory 540 and the calculation results are returned to the management memory 540. When the calculation of the linearity error is ended, the calculation circuit 560 enters a sleep state.

The adjustment value determining circuit 550 generates the adjustment signal for the settling current using the linearity error.

Here, plural threshold values are provided for the linearity error and are compared with the linearity error to determine the adjustment level.

The adjustment value determining, circuit 550 includes a memory 551 and manages the change in adjustment level. This change serves as a factor for determining the adjustment level.

Figure 31:
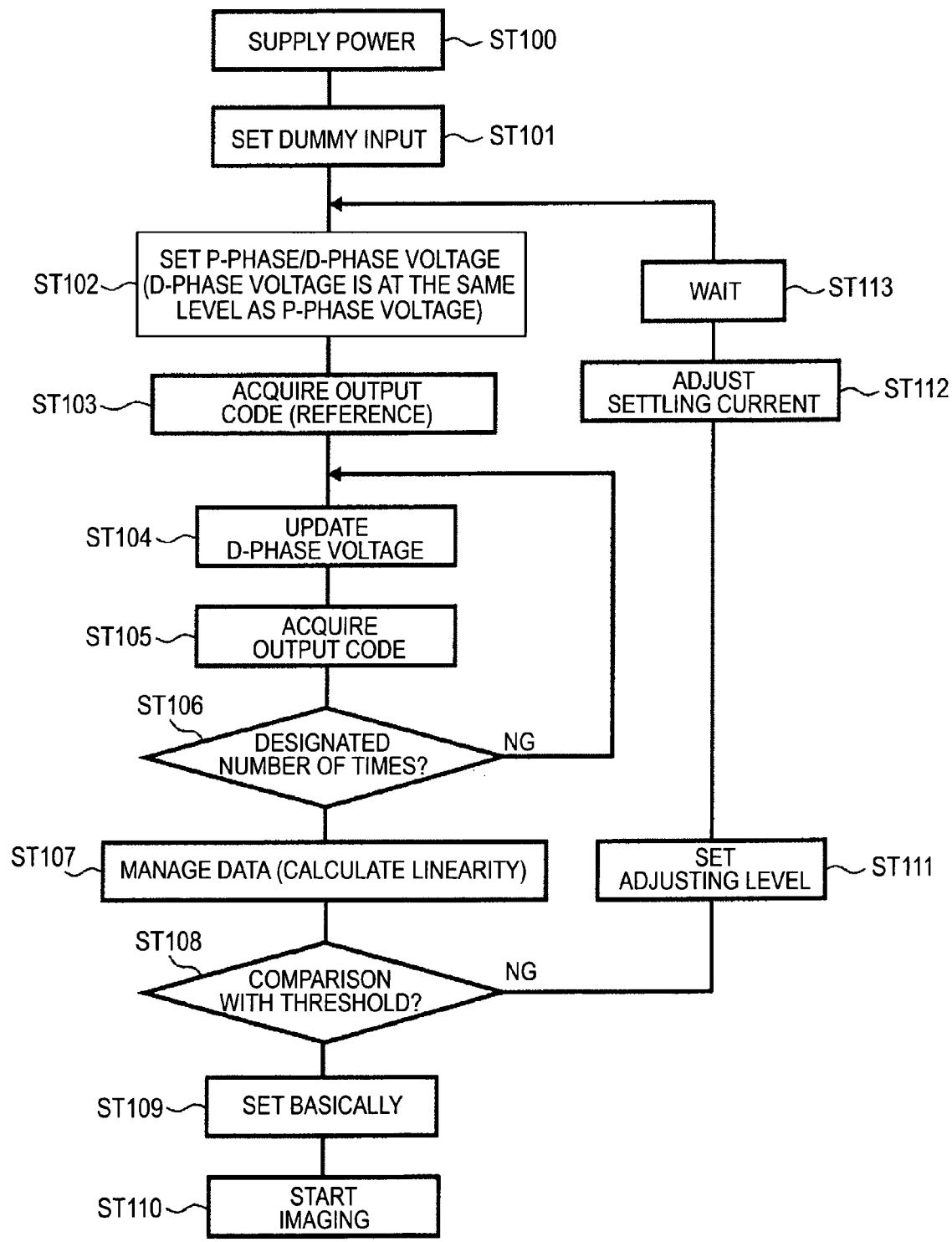
FIG. 31 is a flow diagram illustrating the flow of a procedure of controlling the sensor shown in FIG. 26.

FIG. 31 is a flow diagram illustrating the flow of a procedure of controlling the sensor shown in FIG. 26.

In FIG. 31, it is assumed that the settling current is adjusted just after power is supplied thereto (ST100).

First, a mode where a voltage can be applied to the vertical signal lines 116 (VSL) via the dummy pixels is set (ST101). At this time, it is necessary to turn on the VSL horizontal-connection switches SW accordingly.

The P-phase and D-phase voltages as a reference is set by the voltage generating circuit 410 (ST102) and a reference output code is acquired (ST103).

For a predetermined period of time thereafter, for example, every horizontal scanning period H, the D-phase voltage is updated (ST104) and the output code is acquired (ST105). When a designated number of times is reached (ST106), the linearity is calculated (ST107).

When the linearity error is smaller than a threshold value, it is determined that the adjustment of the settling current is not necessary, and the imaging is started (ST108, ST109, and ST110).

On the contrary, when the linearity error is great and it is thus determined that the adjustment of the settling current is necessary, the set value of the current source for determining the settling current is adjusted (ST111, ST112, and ST113), and the same sequence from step ST102 is performed.

This feedback process can be repeated plural times, thereby increasing the processing time.

Accordingly, this process can be optimally performed at the time of supplying power or releasing the standby state. At this time, the adjustment value is acquired to cancel the manufacturing differences.

Since the optimal value may vary due to a variation in temperature during use, it is necessary to periodically calculate and monitor the linearity.

Here, since it is thought that the variation in temperature is not rapid but slow with the lapse of time, it is possible to guarantee the optimal linearity by performing the adjustment in a blanking period of 1 V or the like.

Until the analog level is stabilized after the settling current is adjusted, a predetermined time is taken. Accordingly, when the adjustment is performed in the blanking period or the like, it is necessary to perform the adjustment in consideration of the release time.

<4. Second Formation of Reference Signal by DAC>

The DAC as a reference signal generating circuit according to this embodiment that generates the reference signal RAMP has the following specific second configuration as described above.

In the first configuration, it is possible to generate the ramp wave having linearity by causing the settling current to flow for a predetermined time from the time of starting the generation of the reference signal RAMP, but the current consumption is likely to increase.

Therefore, the DAC 161 having the second configuration is configured to generate the ramp wave having linearity while suppressing the increase in current consumption.

The DAC 161A includes a reference-signal generating current source connected to the output node of the reference signal and an output load portion that is connected to the output node and that allows the reference signal of the level corresponding to the reference-signal generating current from the reference-signal generating current source to appear at the output node. The output load portion sets the first load value before starting the generation of the reference signal to a load value other than the second load value at the time of starting the generation of the reference signal.

For example, the load value is a resistance value, and the output load portion sets the first load value to a value smaller than the second load value.

The DAC 161A sets the load value of the output load portion to the second load value for a predetermined time from the time of starting the generation of the reference signal.

The DAC 161A sets the load value of the output load portion to the first load value when the predetermined time passes from the time of starting the generation of the reference signal.

The output load portion of the DAC 161A includes plural adjusting loads and has a function of adjusting the number of adjusting loads to give an offset to the reference signal.

Similarly to the first configuration, the DAC 161A may employ the configuration including a circuit that automatically adjusts the offset of the reference signal when the slope of the reference signal is variable and the slope of the reference signal varies.

A specific example of the second configuration will be described below.

In the following description, the DAC 161A employing the second configuration is referenced by reference numeral 600.

Figure 32:
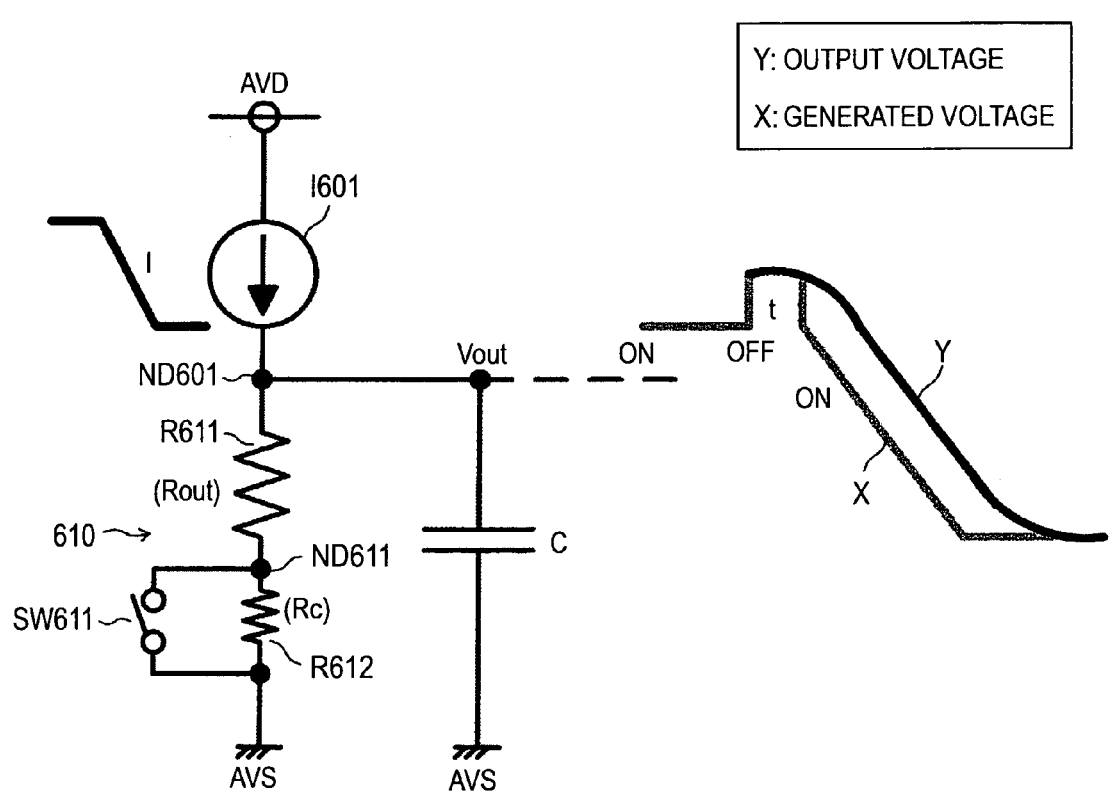
FIG. 32 is a diagram schematically illustrating a first example of a DAC as a reference signal generating circuit employing a second configuration.

FIG. 32 is a diagram schematically illustrating a first example of a DAC as a reference signal generating circuit employing the second configuration.

The DAC 600 shown in FIG. 32 includes a reference-signal generating current source I601, an output load portion 610, and an output node ND601. In FIG. 32, C represents a line capacitor.

In FIG. 32, X represents the generated voltage and Y represents the output voltage.

The current source I601 is connected between a power source AVD and the output node ND601.

As described above, in the current source I601, the current value to be supplied is switched at a predetermined time so that the reference signal (ramp signal) RAMP should have a slope shape varying in a line shape with a slope.

The output load portion 610 includes an output resistor R611 (Rout), an adjusting resistor R612 (Rc), and a switch SW611.

The output resistor R611 and the adjusting resistor R612 are connected in series between the output node ND 601 and the reference potential AVS. The switch SW611 is connected in parallel with the adjusting resistor R612 between the reference potential AVS and the connection node ND611 of the output resistor R611 and the adjusting resistor R612.

Before starting the generation of the reference signal RAMP, the output load portion 610 turns on the switch SW611 to bypass the adjusting resistor R612 and to set the first load value to the resistance Rout of the adjusting resistor R611, for example, under the control of the timing control circuit 140. At this time, the voltage value is (I·Rout).

At the time of starting the generation of the reference signal RAMP (before the effective output), the output load portion 610 turns off the switch SW611 to allow a current to flow in the adjusting resistor R612 and to set the load value to the resistance value (Rout+Rc) which is the second load value higher than the first load value Rout. That is, at the time of starting the generation of the reference signal RAMP, the voltage is offset (shifted) from (I·Rout) to (I·(Rout+Rc)). The output load portion 610 holds this state for a predetermined period of time t.

When the predetermined period of time t passes, the output load portion 610 turns on the switch SW611 to bypass the adjusting resistor R612 and shifts the load value from the resistance value (Rout+Rc) as the second load value to the first load value (I·Rout).

Actually, the effective output of the reference signal RAMP is started when the predetermined period of time t passes.

That is, at the time of outputting the effective reference signal RAMP after the predetermined period of time t passes in the state where the resistance value (Rout+Rc) as the optimal load value at the time of starting the output of the reference signal RAMP is set, the load value is returned to the resistance value Rout. Accordingly, as shown in FIG. 32, it is possible to suppress the bluntness in the reference signal RAMP and to maintain the linearity well.

As described above, by switching the output load value at the time of starting the output of the reference signal RAMP and before and after the time, it is possible to suppress the increase in current consumption and to generate the reference signal RAMP having linearity.

Figure 33:
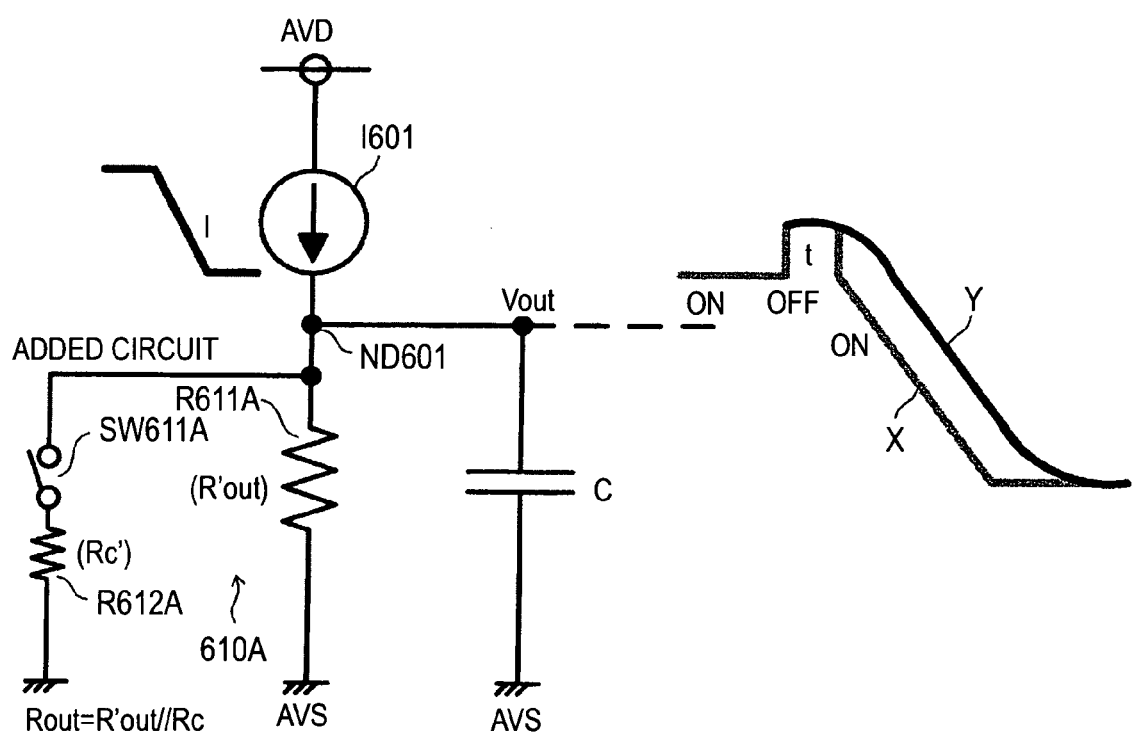
FIG. 33 is a diagram schematically illustrating a second example of a DAC as a reference signal generating circuit employing the second configuration.

FIG. 33 is a diagram schematically illustrating a second example of the DAC as a reference signal generating circuit employing the second configuration.

The DAC 600A shown in FIG. 33 is different from the DAC 600 shown in FIG. 32, in the connection between the adjusting resistor R612A and the switch SW 611A in the output load portion 610A.

That is, in the output load portion 610A shown in FIG. 33, the adjusting resistor R612A and the switch SW611A are connected in series between the output node ND601 and the reference potential AVS.

In the output load portion 610A, the output resistor R611A with a resistance value Rout' and the adjusting resistor R612A with a resistance value Rc' are connected in parallel when the switch SW611A is turned on.

Before starting the generation of the reference signal RAMP, the output load portion 610A turns on the switch SW611, for example, under the control of the timing control circuit 140. Accordingly, the adjusting resistor R612A and the output resistor R611A are connected in parallel to set the first load value to the combined resistance value (Rout'·Rc')/(Rout'+Rc') of both resistance values. At this time, the voltage value is I·((Rout'·Rc')/(Rout'+Rc')).

At the time of starting the generation of the reference signal RAMP (before the effective output), the output load portion 610A turns off the switch SW611A to bypass the adjusting resistor R612A and to sets the load value to the resistance value Rout' as the second load value higher than the first load value Rout. That is, at the time of starting the generation of the reference signal RAMP, the voltage is offset (shifted) from I·((Rout'·Rc')/(Rout'+Rc')) to (I·Rout'). The output load portion 610A maintains this state for the predetermined period of time t.

When the predetermined period of time t passes, the output load portion 610A turns on the switch SW611A to connect the adjusting resistor R612A and the output resistor R611A in parallel. Accordingly, the output load portion 610A shifts the load value from the second load value Rout' to the first load value (Rout'·Rc')/(Rout'+Rc').

Actually, the effective output of the reference signal RAMP is started when the predetermined period of time t passes.

That is, at the time of outputting the effective reference signal RAMP after the predetermined period of time t passes in the state where the resistance value Rout' as the optimal load value at the time of starting the output of the reference signal RAMP is set, the load value is returned to the resistance value ((Rout'·Rc')/(Rout'+RC'). Accordingly, as shown in FIG. 33, it is possible to suppress the bluntness in the reference signal RAMP and to maintain the linearity well.

According to this example, by switching the output load value at the time of starting the output of the reference signal RAMP and before and after the time, it is possible to suppress the increase in current consumption and to generate the reference signal RAMP having linearity.

Figure 34:
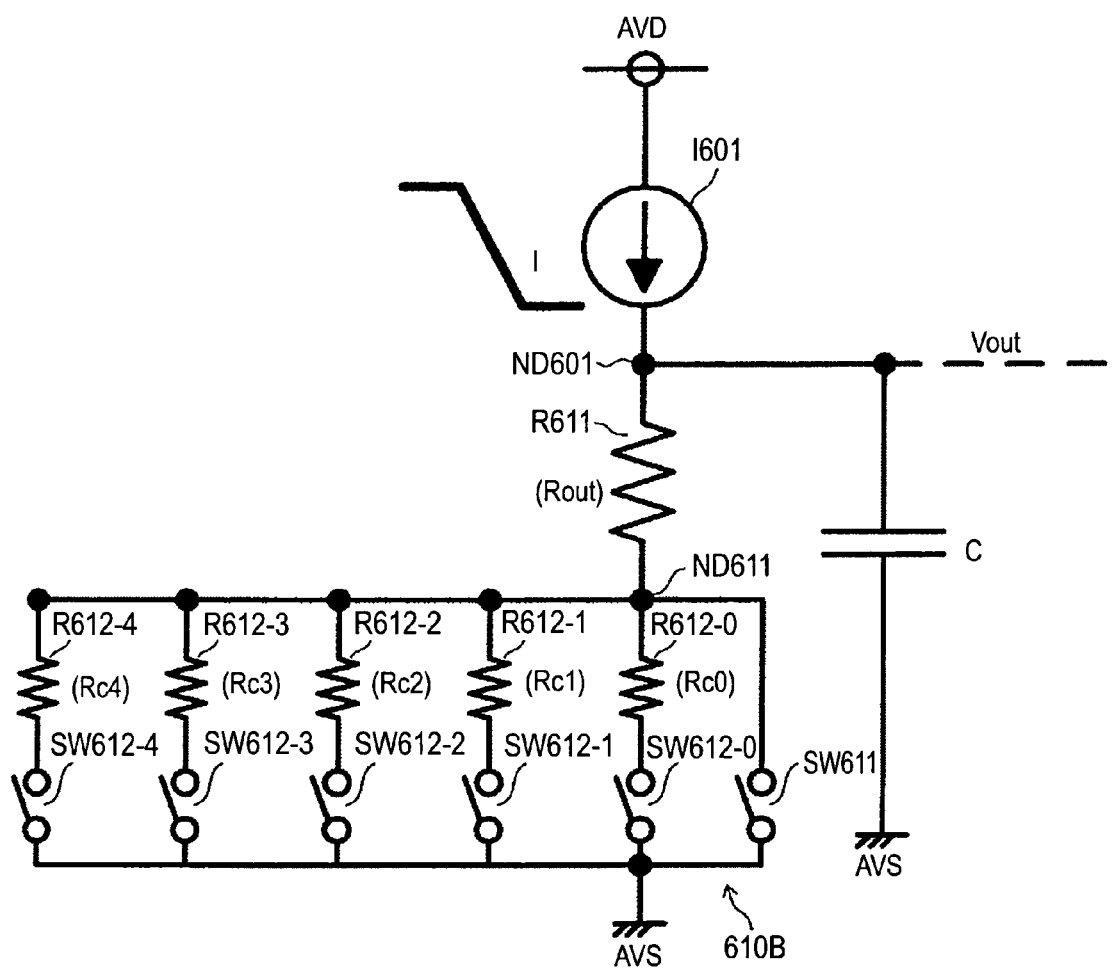
FIG. 34 is a diagram schematically illustrating a third example of a DAC as a reference signal generating circuit employing the second configuration.

FIG. 34 is a diagram schematically illustrating a third example of the DAC as a reference signal generating circuit employing the second configuration.

The DAC 600B shown in FIG. 34 is different from the DAC 600 shown in FIG. 32, in that plural adjusting resistors and plural switches are connected in the output load portion 610B.

The output load portion 610B includes adjusting resistors R612-1 to R612-4 and switches SW612-0 to SW612-4 in addition to the adjusting resistor R612 (–0) and the switch SW611 of the DAC 600 shown in FIG. 32 so as to adjust the offset to a desired value.

The adjusting resistor R612-0 and the switch SW612-0 are connected in series between the node ND611 and the reference potential AVD.

The adjusting resistor R612-1 and the switch SW612-1 are connected in series between the node ND611 and the reference potential AVD.

The adjusting resistor R612-2 and the switch SW612-2 are connected in series between the node ND611 and the reference potential AVD.

The adjusting resistor R612-3 and the switch SW612-3 are connected in series between the node ND611 and the reference potential AVD.

The adjusting resistor R612-4 and the switch SW612-4 are connected in series between the node ND611 and the reference potential AVD.

In this way, the output load portion 610B includes plural adjusting resistors R612-0 to R612-4 and has a function of adjusting the number of adjusting resistors connected to the output resistor R611 so as to give an offset to the reference signal RAMP.

For example, under the control of the timing control circuit 140, the output load portion 610B selectively turns on or off the switches SW611 and SW612-0 to SW612-4 to select the optimal output load value and to adjust the offset to a desired value.

According to this example, by switching the output load value at the time of starting the output of the reference signal RAMP and before and after the time, it is possible to suppress the increase in current consumption and to generate the reference signal RAMP having linearity.

Figure 35:
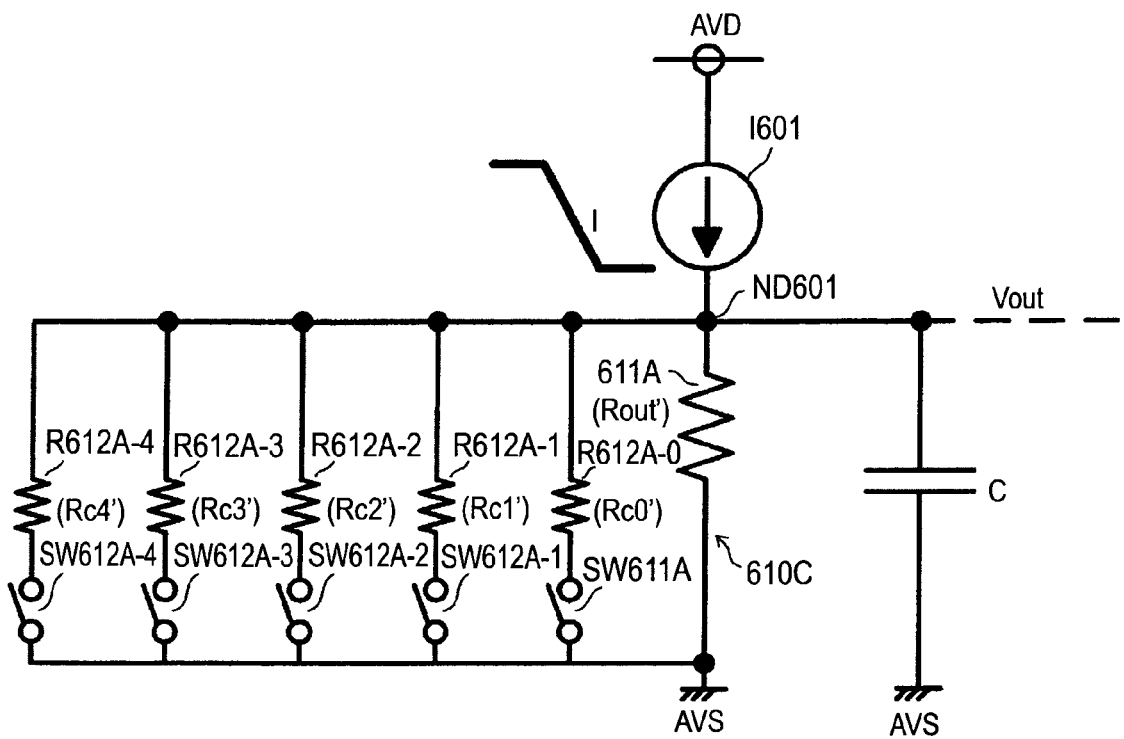
FIG. 35 is a diagram schematically illustrating a fourth example of a DAC as a reference signal generating circuit employing the second configuration.

FIG. 35 is a diagram schematically illustrating a fourth example of the DAC as a reference signal generating circuit employing the second configuration.

The DAC 600C shown in FIG. 35 is different from the DAC 600A shown in FIG. 33, in that plural adjusting resistors and plural switches are connected in the output load portion 610C.

The output load portion 610C includes the following elements in addition to the adjusting resistor R612A (–0) and the switch SW611A of the DAC 600A shown in FIG. 33 so as to adjust the offset to a desired value.

That is, the output load portion 610C includes adjusting resistors R612A-1 to R612A-4 and switches SW612-1 to SW612-4 in addition to the adjusting resistor R612A (–0) and the switch SW611A.

The adjusting resistor R612A-0 and the switch SW611A are connected in series between the output node ND601 and the reference potential AVD.

The adjusting resistor R612A-1 and the switch SW612A-1 are connected in series between the output node ND601 and the reference potential AVD.

The adjusting resistor R612A-2 and the switch SW612A-2 are connected in series between the output node ND601 and the reference potential AVD.

The adjusting resistor R612A-3 and the switch SW612A-3 are connected in series between the output node ND601 and the reference potential AVD.

The adjusting resistor R612A-4 and the switch SW612A-4 are connected in series between the output node ND601 and the reference potential AVD.

In this way, the output load portion 610C includes plural adjusting resistors R612A-0 to R612A-4 and has a function of adjusting the number of adjusting resistors connected to the output resistor R611 so as to give an offset to the reference signal RAMP.

For example, under the control of the timing control circuit 140, the output load portion 610C selectively turns on or off the switches SW611A and SW612A-1 to SW612A-4 to select the optimal output load value and to adjust the offset to a desired value.

According to this example, by switching the output load value at the time of starting the output of the reference signal RAMP and before and after the time, it is possible to suppress the increase in current consumption and to generate the reference signal RAMP having linearity.

In the above-mentioned solid-state imaging device according to this embodiment, the following advantages can be obtained.

According to this embodiment, it is possible to improve the settling time of the reference voltage without being influenced by environmental conditions such as a variation in temperature or process variations of wafers.

As a result, since the reading speed of a sensor can be enhanced, it is possible to accomplish an increase in the number of pixels and an increase in frame rate.

Since the blunt period of the reference signal (voltage) is reduced, it is possible to broaden the effective range.

Even when the blocks generating the timing signal for starting the generation of the reference signal (voltage) and the timing signal for applying the settling current are different from each other, no difference is generated between both timing signals, thereby giving a degree of freedom to the circuit configuration.

In a system in which the slope of the reference signal (voltage) is variable, since the settling current can be automatically adjusted at the time of changing the slope, it is possible to remove the unnecessary control circuit and to simplify the processes.

The P-phase voltage and the D-phase voltage can be generated independently by the voltage generating circuit and the timing can be freely switched by the sensor management block. Accordingly, it is possible to easily assemble the sequence of adjusting the settling current into the normal sensor operation and to simply switch the operations.

In addition to the above-mentioned advantages, it is possible to suppress the increase in current consumption and to generate the reference signal RAMP having linearity by employing the second configuration.

The solid-state imaging device having the above-mentioned advantages can be used as an imaging device of a digital camera or a video camera.

<5. Configuration of Camera System>

Figure 36:
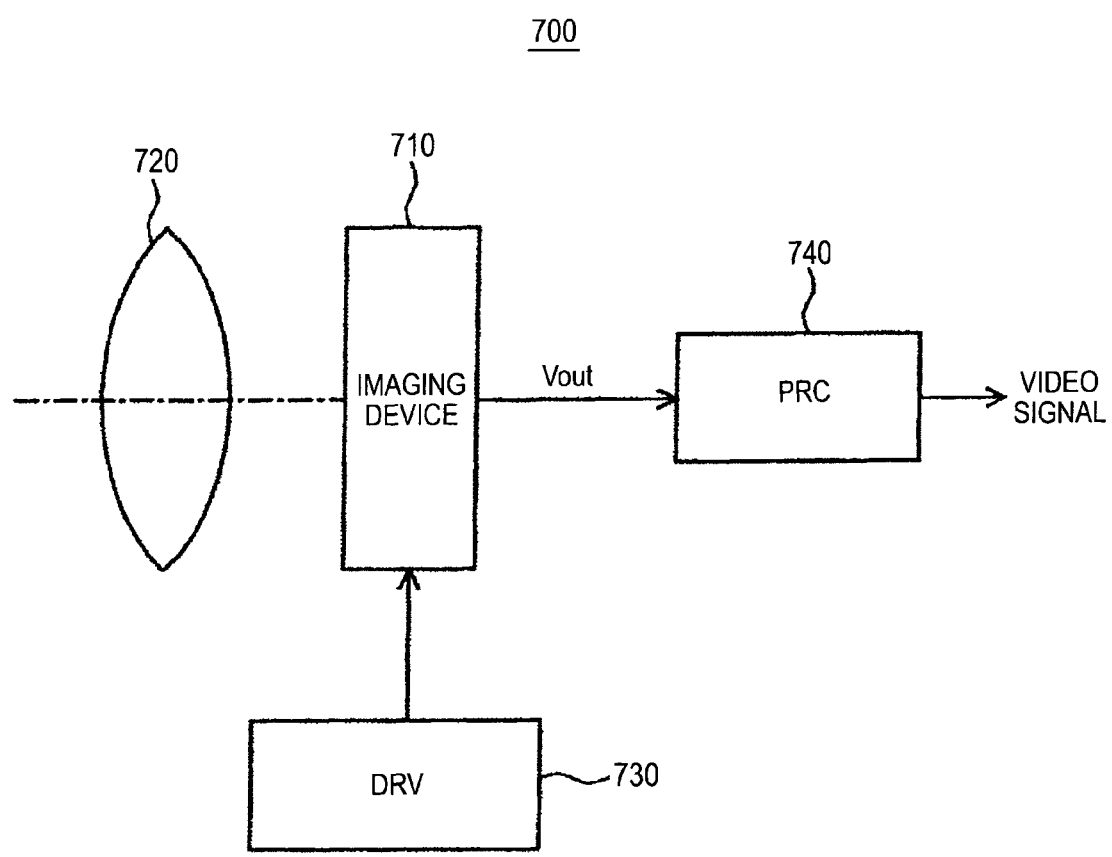
FIG. 36 is a diagram illustrating the configuration of a camera system employing a solid-state imaging device according to the embodiment of the invention.

FIG. 36 is a diagram illustrating the configuration of a camera system employing the solid-state imaging device according to this embodiment.

As shown in FIG. 36, the camera system 700 includes an imaging device 710 employing the solid-state imaging device 100 according to this embodiment.

The camera system 700 includes, for example, a lens 720 that focuses incident light (image light) on an imaging plane as an optical system that guides the incident light (forms a subject image) to the pixel area of the imaging device 710.

The camera system 700 further includes a driving circuit (DRV) 730 that drives the imaging device 710 and a signal processing circuit (PRC) 740 that processes the output signals of the imaging device 710.

The driving circuit 730 includes a timing generator (not shown) that generates various timing signals such as a start pulse and a clock pulse for driving the circuits in the imaging device 710 and drives the imaging device 710 with predetermined timing signals.

The signal processing circuit 740 performs a predetermined signal process on the output signals of the imaging device 710.

The image signals processed by the signal processing circuit 740 are recorded on a recording medium such as a memory. A hard copy of the image information recorded on the recording medium is printed by a printer or the like. The image signals processed by the signal processing circuit 740 are displayed as a video on a monitor made up of a liquid crystal display.

As described above, by mounting the above-mentioned solid-state imaging device 100 as the imaging device 710 on the imaging apparatus such as a digital still camera, it is possible to implement a high-precision camera.

The present application contains subject matter related to those disclosed in Japanese Priority Patent Applications JP 2010-111460 and JP 2011-032394 filed in the Japan Patent Office on May 13, 2010 and Feb. 17, 2011, respectively, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A signal processing circuit comprising:
   a reference signal generating circuit configured to generate a reference signal of a ramp waveform of which a voltage value varies with the lapse of time by changing a current; and
   a signal processing unit including a plurality of processing sections respectively configured to process the reference signal and a potential of a supplied analog signal,
   wherein the reference signal generating circuit is configured to adjust an offset of the reference signal by adjusting the current from the time of starting the generation of a ramp portion of the reference signal or to adjust the level of the reference signal at least at the time of starting the generation of the rams portion of the reference signal, and
   wherein the reference signal generating circuit adjusts the offset of the reference signal by a fixed amount for a predetermined period of time, wherein the predetermined period of time is substantially coextensive with the ramp portion of the reference signal.

2. The signal processing circuit according to claim 1, wherein the reference signal generating circuit includes a synchronization circuit configured to make a synchronization to absorb a difference between a start time of generating the ramp portion of the reference signal and a current application time.

3. The signal processing circuit according to claim 1, wherein the reference signal generating circuit includes a circuit configured to automatically adjust the offset of the reference signal, when the slope of the reference signal is variable and the slope of the reference signal varies.

4. The signal processing circuit according to claim 1, wherein the reference signal generating circuit includes:
   a reference-signal generating current source that is connected to an output node of the reference signal; and
   an output load portion that is connected to the output node and is configured to allow the reference signal of a level corresponding to a reference-signal current from the reference-signal generating current source to appear at the output node,
   wherein the output load portion is configured to set its load value to a first load value before starting the generation of the reference signal and to set its load value to a second load value different from the first load value at the time of starting the generation of the ramp portion of the reference signal.

5. The signal processing circuit according to claim 4, wherein the reference signal generating circuit is configured to set the load value of the output load portion to the second load value for the predetermined period of time from the time of starting the generation of the ramp portion of the reference signal and to set the load value of the output load portion to the first load value after the predetermined period of time passes.

6. The signal processing circuit according to claim 4, wherein the output load section of the reference signal generating circuit includes a plurality of adjusting loads, the output load section configured to adjust the number of the plurality of adjusting loads to give an offset to the reference signal.

7. The signal processing circuit according to claim 1, wherein the reference signal generating circuit is configured to allow a settling current other than the current for generation of the reference signal to flow for the predetermined period of time from the time of starting the generation of the ramp portion of the reference signal.

8. The signal processing circuit according to claim 7, wherein the reference signal generating circuit includes a plurality of current sources respectively configured to allow a current to flow at the time of starting the generation of the ramp portion of the reference signal, the reference signal generating circuit configured to adjust the number of the plurality of current sources to give the offset to the reference signal.

9. The signal processing circuit according to claim 7, wherein the reference signal generating circuit includes:
   a reference-signal generating current source configured to generate the reference signal; and
   a settling-current current source configured to allow the settling current to flow.

10. The signal processing circuit according to claim 9, wherein the reference signal generating circuit is configured to switch a back-bias voltage of a reference-voltage generating current source transistor.

11. A solid-state imaging device comprising:
   a pixel unit in which a plurality of pixels performing a photoelectric conversion are arranged in a matrix shape; and
   a pixel signal reading unit including a column signal processing circuit configured to read pixel signals from the pixel unit to signal lines in terms of a plurality of pixels and to perform an analog-digital (AD) conversion on the read pixel signals,
   wherein the column signal processing circuit of the pixel signal reading unit includes
   a reference signal generating circuit configured to generate a reference signal of a ramp waveform of which a voltage value varies with the lapse of time by changing a current,
   a plurality of comparators respectively configured to compare the reference signal with a potential of an analog signal read from the corresponding column, and
   a plurality of counter latches respectively disposed to correspond to the plurality of comparators, and configured to count a comparison time of the corresponding comparator, and to stop the counting and latch the counted value when the output of the corresponding comparator is inverted,
   wherein the reference signal generating circuit is configured to adjust an offset of the reference signal by adjusting the current from the time of starting the generation of the a ramp portion of reference signal or to adjust the level of the reference signal at least at the time of starting the generation of the ramp portion of the reference signal, and
   wherein the reference signal generating circuit adjusts the offset of the reference signal by a fixed amount for a predetermined period of time, wherein the predetermined period of time is substantially coextensive with the ramp portion of the reference signal.

12. The signal solid-state imaging device according to claim 11, wherein the reference signal generating circuit includes a synchronization circuit configured to make a synchronization to absorb a difference between a start time of generating the ramp portion of the reference signal and a current application time.

13. The solid-state imaging device according to claim 11, wherein the reference signal generating circuit includes:
   a reference-signal generating current source that is connected to an output node of the reference signal; and
   an output load portion that is connected to the output node and is configured to allow the reference signal of a level corresponding to a reference-signal current from the reference-signal generating current source to appear at the output node,
   wherein the output load portion is configured to set its load value to a first load value before starting the generation of the ramp portion of the reference signal and to set its load value to a second load value different from the first load value at the time of starting the generation of the ramp portion of the reference signal.

14. The solid-state imaging device according to claim 11, wherein the reference signal generating circuit includes a circuit configured to automatically adjust the offset of the reference signal, when the slope of the reference signal is variable and the slope of the reference signal varies.

15. The solid-state imaging device according to claim 11, further comprising:
   a dummy pixel configured to input a voltage from an external location to the signal line;
   a voltage generating circuit configured to provide a voltage level to the dummy pixel; and
   a horizontal-connection switch configured to smooth the input voltage level.

16. The solid-state imaging device according to claim 11, wherein the reference signal generating circuit is configured to allow a settling current other than the current for generation of the reference signal to flow for the predetermined period of time from the time of starting the generation of the ramp portion of the reference signal.

17. The solid-state imaging device according to claim 16, wherein the reference signal generating circuit includes a plurality of current sources respectively configured to allow a current to flow at the time of starting the generation of the ramp portion of the reference signal, the reference signal generating circuit configured to adjust the number of the plurality of current sources to give the offset to the reference signal.

18. The solid-state imaging device according to claim 16, wherein the reference signal generating circuit includes:
   a reference-signal generating current source configured to generate the reference signal; and
   a settling-current current source configured to allow the settling current to flow.

19. The signal solid-state imaging device according to claim 18, wherein the reference signal generating circuit is configured to switch a back-bias voltage of a reference-voltage generating current source transistor.

20. A camera system comprising:
   a solid-state imaging device; and
   an optical system configured to form an image of a subject on the solid-state imaging device,
   wherein the solid-state imaging device includes
   a pixel unit in which a plurality of pixels performing a photoelectric conversion are arranged in a matrix shape; and
   a pixel signal reading unit including a column signal processing circuit configured to read pixel signals from the pixel unit to signal lines in terms of a plurality of pixels and to perform an analog-digital (AD) conversion on the read pixel signals,
   wherein the column signal processing circuit of the pixel signal reading unit includes a reference signal generating circuit configured to generate a reference signal of a ramp waveform of which a voltage value varies with the lapse of time by changing a current, a plurality of comparators respectively configured to compare the reference signal with a potential of an analog signal read from the corresponding column, and a plurality of counter latches respectively disposed to correspond to the plurality of comparators, and configured to count a comparison time of the corresponding comparator, and to stop the counting and latch the counted value when the output of the corresponding comparator is inverted, wherein the reference signal generating circuit is configured to adjust an offset of the reference signal by adjusting the current from the time of starting the generation of a ramp portion of the reference signal or to adjust the level of the reference signal at least at the time of starting the generation of the ramp portion of the reference signal, and wherein the reference signal generating circuit adjusts the offset of the reference signal by a fixed amount for a predetermined period of time, wherein the predetermined period of time is substantially coextensive with the ramp portion of the reference signal.

21. The camera system according to claim 20, wherein the reference signal generating circuit includes:

a reference-signal generating current source that is connected to an output node of the reference signal; and an output load portion that is connected to the output node and is configured to allow the reference signal of a level corresponding to a reference-signal current from the reference-signal generating current source to appear at the output node, wherein the output load portion is configured to set its load value to a first load value before starting the generation of the ramp portion of the reference signal and to set its load value to a second load value different from the first load value at the time of starting the generation of the ramp portion of the reference signal.

22. The camera system according to claim 20, further comprising:

a dummy pixel configured to input a voltage from an external location to the signal line;

a voltage generating circuit configured to provide a voltage level to the dummy pixel; and a horizontal-connection switch configured to smooth the input voltage level.

23. The camera system according to claim 20, wherein the reference signal generating circuit is configured to allow a settling current other than the current for generation of the reference signal to flow for the predetermined period of time from the time of starting the generation of the ramp portion of the reference signal.

24. The camera system according to claim 23, wherein the reference signal generating circuit includes a plurality of current sources respectively configured to allow a current to flow at the time of starting the generation of the ramp portion of the reference signal, the reference signal generating circuit configured to adjust the number of the plurality of current sources to give the offset to the reference signal.

25. The camera system according to claim 23, wherein the reference signal generating circuit includes:

a reference-signal generating current source configured to generate the reference signal; and a settling-current current source configured to allow the settling current to flow.

* * * * *